United States Patent [19]
Rust et al.

[11] Patent Number: 5,453,970
[45] Date of Patent: Sep. 26, 1995

[54] MOLECULAR MEMORY MEDIUM AND MOLECULAR MEMORY DISK DRIVE FOR STORING INFORMATION USING A TUNNELLING PROBE

[76] Inventors: Thomas F. Rust; Joanne P. Culver, both of 43 Asilomar Cir., Oakland, Calif. 94611

[21] Appl. No.: 90,664

[22] Filed: Jul. 13, 1993

[51] Int. Cl.$^6$ .................................................. G11B 9/00
[52] U.S. Cl. ........................... 369/176; 365/151; 365/128; 250/306; 250/307; 369/101
[58] Field of Search ..................... 250/306, 307; 365/151, 114, 118; 369/126, 101

[56] References Cited

U.S. PATENT DOCUMENTS

| | | | |
|---|---|---|---|
| 4,575,822 | 3/1986 | Quate | 365/174 |
| 4,826,732 | 5/1989 | Kazan et al. | 428/432 |
| 4,829,507 | 5/1989 | Kazan et al. | 369/126 |
| 4,916,688 | 4/1990 | Foster et al. | 369/126 |
| 4,945,515 | 7/1990 | Ooumi et al. | 365/174 |
| 4,962,480 | 10/1990 | Ooumi et al. | 365/151 |
| 4,987,312 | 1/1991 | Eigler | 369/126 |
| 5,038,322 | 8/1991 | VanLoenen | 365/114 |
| 5,051,977 | 9/1991 | Goldberg | 369/126 |
| 5,091,880 | 2/1992 | Isono et al. | 365/151 |
| 5,144,148 | 9/1992 | Eigler | 369/126 |
| 5,262,981 | 11/1993 | Rabe et al. | 365/151 |
| 5,265,046 | 11/1993 | Fuchs et al. | 365/151 |
| 5,289,455 | 2/1994 | Kuroda et al. | 250/306 |

OTHER PUBLICATIONS

Shen, T. C. et al., *Ion Irradiation Effects On Graphite With The Scanning Tunneling Microscope*, Mar.–Apr. 1991, J. Vac. Sci. Technol., B 9 (2), pp. 1376–1379.

Staufer, U. et al., *Tailoring Nanostructures With A Scanning Tunneling Microscope*, Mar.–Apr. 1991, J. Vac. Sci. Technol., B 9 (2), pp. 1389–1393.

Mamin, H. J. et al., *Gold Deposition From A Scanning Tunneling Microscope Tip*, Mar.–Apr. 1991, J. Vac. Sci. Technol., B 9 (2), pp. 1398–1402.

Dagata, J. A. et al., *Pattern Generation On Semiconductor Surfaces By a Scanning Tunneling Microscope Operating In Air*, Mar.–Apr. 1991, J. Vac. Sci. Technol., B 9 (2), pp. 1384–1388.

Albrecht, T. R. et al., *Nanometer–Scale Hole Formation Using A Scanning Tunneling Microscope*, Oct. 1989, Appl. Phys. Lett., vol. 55, No. 17, pp. 1727–1729.

Aono, M., *Has Japan Begun to Move Toward Atomic Level Material Processing?* Oct. 1992, Science, vol. 258, pp. 586–587.

*Primary Examiner*—Georgia Y. Epps
*Assistant Examiner*—Kim-Kwok Chu
*Attorney, Agent, or Firm*—Limbach & Limbach; Ian Hardcastle

[57] ABSTRACT

A molecular memory medium for storing digital bits at a density of several hundred million per square centimeter. The medium is read and written by a tunnelling probe, and comprises a plane surface and a means for moving the surface relative to the tunnelling probe. Arrayed on the surface are plural memory elements, each storing one bit, and having, relative to the surface, a first positional state and a second positional state, representing the first state and the second state, respectively, of the bit. The positional states are distinguished from one another by a difference in a tunnelling current in the tunnelling probe. The memory element is switched from one positional state to the other by an electrostatic force applied by the tunnelling probe. A molecular memory apparatus for reading such a molecular memory medium includes a tunnelling probe, a drive for moving the storage medium relative to the tunnelling probe, and a controller for positioning the tunnelling probe relative to the track and the surface. A voltage applying circuit applies a voltage to the tunnelling probe, and a circuit causes the voltage applying circuit to apply a first voltage to the tunnelling probe and measures the resulting tunnelling current that depends on the positional state of the memory element adjacent to the tunnelling probe. Finally, a circuit determines from the tunnelling current the digital state represented by the memory element adjacent to the tunnelling probe, and provides the determined digital state as an output bit.

47 Claims, 22 Drawing Sheets

MOLECULAR MEMORY MEDIUM AND MOLECULAR MEMORY DISK DRIVE FOR STORING INFORMATION USING A TUNNELLING PROBE

BACKGROUND OF THE INVENTION

Conventional disk drives employ various reading and writing methods. In the magnetic memory method, a memory section formed by a magnetic powder is magnetized either longitudinally within its plane or perpendicular to the plane of the memory section. Another type of prior art apparatus employs an opto-magnetic recording method in which a magnetic film is magnetized in a predetermined direction and a laser beam is then applied to a position on the film where recording is to be effected to raise the temperature at the recording position, thereby inverting the direction of magnetization. Another type of prior art employs an optical recording method wherein a film is written by a focused laser beam which heats up and deforms the film, and is read by a lower power laser beam. Another type of prior art operating on a molecular scale employs a fine tip to change the state of electrons on a variety of different surfaces.

The conventional disk drives that employ the above described methods suffer, however, from the following problems. Magnetic memory systems employ a read/write mechanism which can come in contact with the memory section. Over time this degrades the operation of the memory system. The size of the memory domains are dependent on the size of the read/write head. The read/write head is difficult to manufacture in order to achieve small domain sizes. Also, as the domain size gets smaller, it becomes necessary for the read/write head to operate closer to the memory surface. This increases the problems of manufacturing both the head and the memory surface for flatness. It also increases memory and read/write head wear, reducing the lifetime usefulness of the memory device. Compact disk optical memory systems are a read-only type of memory. This limits their usefulness is applications which require that data be changed and updated often.

Many optical memory systems can have data written only once. After the entire memory area has been written, the device becomes a read-only memory, limiting its usefulness in applications which require that data be changed often. Optical systems are limited by the wavelength of the light used in the reading and writing apparatus, and the size of the optical system guiding the light to the memory surface. Diffraction limiting requires that, for a smaller domain size, the optical system must get closer to the memory surface. This increases head wear and reduces the lifetime of the memory device. These limits define the minimum size of the memory .domain to a value much greater than the size of a single atom or molecule.

In U.S. Pat. Nos. 4,945,515 & 4,962,480 of Ooumi et al., molecular memory systems operating via the changing of states of electrons are described. These systems are limited by the low mass and high mobility of electrons. The electron charge state that is written in the memory rapidly diffuses, causing a rapid loss of memory data. The patents also describe using multiple needles that are linked together and must move as a group. This limits the practical applicability of this arrangement, since molecular surfaces are rarely flat over a large area. Also, the need to manufacture the tips to conform to the surface within the few Angstroms needed for the tunneling effect is a limiting factor.

In U.S. Pat. No. 5,038,322 of van Loenen, a system for inscribing information into a molecular memory surface is described. This system requires a fine tip to be raised and lowered into the memory surface, and the tip must come in contact with the memory surface. The tip must be raised and lowered for each bit of information. The mass of the tip and the force driving the tip defines the speed at which this process can operate. These parameters require that this speed be limited to far below the Megahertz rate at which typical disk memory systems operate. Also the need for the tip to contact the surface greatly increases the wear on both the tip and the memory, reducing the lifetime of the device.

In U.S. Pat. No. 5,051,977, Goldberg describes a molecular memory system utilizing a fine tip for writing and a modulated focused light source to create a chemical modification of a molecular memory surface to read the memory. A fluorescence property of an underlying substrate in conjunction with the altered tunneling properties of the information layer is used to read the information layer as the fine tip is passed over the information layer. This system also suffers from being a write once memory system, as the chemical process induced by the tip and light source is not reversible. In addition, the additional complexity of an optical system for writing and reading the memory increases the cost of the system.

In U.S. Pat. No. 5,091,880, Iseno et al. describe a molecular memory system utilizing a fine tip for reading and for writing and a focused light source and light sensor for determining position. As this system uses a conventional optical system for finding the track and sector information, the number of tracks, and consequently the overall density, is limited by diffraction of the light focused on the memory surface as in optical memory systems. Also, the additional complexity of the optical system increases the cost of the system.

In U.S. Pat. Nos. 4,826,732 and 4,829,507 of Kazan et al., a molecular memory system is described which utilizes the adsorption or de-adsorption of oxygen, sulphur, or gold atoms on an adsorbent carrier. This process uses a monatomic layer of oxygen, sulphur, or gold on a bulk substrate of zinc oxide (ZnO), zinc indium sulphide ($ZnIn_2S_4$), indium oxide ($In_2O_3$), titanium dioxide ($TiO_2$), cadmium sulphide (CdS), or silicon. In addition the process of pre-reading topological information is described, which requires the scanning of the entire usable memory surface. The very large number of possible tracks on a molecular disk requires a prohibitively long amount of time to pre-read the topology. The use of oxygen as a memory element requires that the system be operated in a vacuum, or a nitrogen or other inert (non-air) atmosphere, requiting expensive seals and environment maintenance systems. Although Kazan et al. describes a method for de-adsorbing oxygen so as to require a controlled environment, it is likely that, over a relatively short time, oxygen atoms from the air will re-attach to the substrate, destroying the integrity of the stored data.

In U.S. Pat. No. 4,575,822, Quate describes a molecular memory system composed of a substrate with physical perturbations, a substrate with magnetic domains, a substrate with two layers such that an electric charge is stored, or a substrate composed of a superconducting film, all readable via tunneling current and a fine tip. Superconducting films in current technology must still be cooled far below room temperature, requiting expensive cooling apparatus, and would loose information should the cooling apparatus fail. Using electric charges as the data storage element suffers from the problem of the low mass of the electrons, and the subsequent rapid diffusion of charge, causing loss of stored data, as described above. The portion of the disclosure relating to physical perturbations describes the perturbations as being created by disruption of the surface by a physical probe, focused laser beam, electron beam or other radiation or particle beam. A physical probe suffers from the problem of having a large, irregular surface relative to atomic scale. Attempts to push the tip into the substrate require the need for rapid up and down movements in the Z axis. The speed of this depends on the mass of the tip being moved, and it is difficult to manufacture such a tip mechanism small enough to allow asynchronous up and down movement in the Megahertz range that is required for a disk drive. This up and down hammering would also deform the tip surface in a short time, rendering the tip useless. A focused laser beam suffers from the same size limits as other optical systems as described above. Electron or particle beams also suffer from this focusing problem. The apparatus described in the Quate patent also would probably have to pre-read the topology of the substrate, although this is not mentioned in the patent.

In U.S. Pat. No. 4,916,688, Foster et al. describe a molecular memory system composed of a film of material whose state is altered by controlled heating of local spots in the film surface by a current through a fine tip. This system suffers from the amount of time required to form, and particularly to erase, the spots on the film. The time to erase is much longer by orders of magnitude than the time to write, and requires a careful control of voltage and current levels. Also, during this time, there is no way to measure the position of the tip above the surface. When the tip is in heating mode the current levels between the tip and the surface are much higher than when in tunneling mode. The tip also must come in contact with the surface to provide a sufficient highly conductive path for the heating process to occur. This induces wear on the tip.

OBJECTS AND SUMMARY OF THE INVENTION

It is the primary object of the present invention to provide a molecular memory medium and a molecular memory reading and writing apparatus which overcomes the above-mentioned shortcomings in the prior art, and to provide an improved memory medium and apparatus which operates on groups of molecules or atoms or on single molecules or atoms.

The molecular memory medium and disk drive according to the invention are capable of storing very large quantities of information, and are also capable of reading and writing the data at very high data rates. The molecular memory medium and disk drive according to the invention may be manufactured at a cost comparable to current magnetic disk drives, and at a fraction of the cost required to achieve the same storage capacity. The molecular memory medium and disk drive may be substituted for many devices which currently are used as storage media. Besides replacing disk drives in computer systems, the molecular memory medium and disk drive will replace the magnetic tape systems in video and audio tape recorders. The very high data transfer capabilities, in the hundreds of megabits/sec, will allow the recording and playback of digital high definition (greater than 1024 line resolution) video, and at faster (greater than 30 Hz) frame rates, for much more life-like animation. The vast storage, greater than Petabytes ($10^{15}$ bytes), for a single 120 mm disk surface, will allow the storage of thousands of movies on a single disk. The molecular disk drive may replace magnetic tape in camcorders, digital and analog tape recorders, video tape recorders, and optical media in CD-ROM players. The potential for storing all kinds of information, from high resolution color and black and white still images, through text of every kind, provides the means to make a vast quantity of knowledge immediately available to anyone with a molecular disk drive. For example, the entire contents of the patent library, including high resolution images of all drawings, will easily fit on a fraction of a molecular disk.

A first generation molecular disk drive would have the following specification:

Domain size:
  Domain width: 0.025 microns, or approximately 50 atoms; and
  Domain height (track separation): 0.05 microns or approximately 100 atoms.
With this domain size, the disk parameters would be:
Number of bits per square centimeter: 80 billion Total capacity of 12 centimeter outside diameter, 3.5 cm inside diameter molecular memory disk (single side): 1.03 Terabytes ($1.03 \times 10^{12}$ bytes). Total number of tracks: 1.7 million Data transfer rate at 1800 rpm:
  132 Megabits/sec inner track
  452 Megabits/sec outer track
  Maximum latency, using time to spin one revolution: 33 millisec.

By reducing the number of atoms per domain, the capacity of the molecular memory medium can be increased significantly. For example, with a domain width and track spacing of 5 Ångstroms, the disc parameters would be:

Number of bits per square centimeter: 400 trillion ($400 \times 10^{12}$) Total capacity of 12 centimeter outside diameter, 3.5 cm inside diameter molecular memory disk (single side): 5.174 Petabytes ($5.174 \times 10^{15}$ bytes) Total number of tracks: 170 million Transfer rate at 1800 rpm:
  6.6 Gigabits/sec inner track
  22.6 Gigabits/sec outer track
  Maximum latency, using time to spin one revolution: 33 millisec.

The present invention provides a molecular memory medium for storing digital bits written by a tunnelling probe. The stored digital bits are readable from the medium by the tunnelling probe. The medium comprises a plane surface and a means for moving the surface relative to the tunnelling probe. Arrayed on the surface are plural memory elements each storing one digital bit and having a positional state representing each state of the digital bit stored therein. To simplify the following description, the word "atom," when used to denote the memory element will mean an atom or a molecule.

A memory element in a first positional state relative to the surface represents a digital bit in the first state. A memory element in a second positional state relative to the surface represents a digital bit in the second state. The first positional state is distinguished from the second positional state by a difference in a tunnelling current in the tunnelling probe. The memory element is switched from the first positional state to the second positional state by an electrostatic force applied by the tunnelling probe.

The invention also :provides a molecular memory apparatus for reading digital bits from a molecular memory storage medium. The storage medium comprises plural memory elements arranged on a track on the surface of the storage medium. Each memory element stores one bit and has a positional state representing each state of the bit. The positional state of the memory element is changed by an electrostatic field. The apparatus comprises a tunnelling probe, a drive for moving the storage medium relative to the tunnelling probe, and a controller for positioning the tunnelling probe relative to the track and for setting the distance from the tunnelling probe to the surface of the storage medium. The apparatus also includes a voltage applying circuit for applying a voltage to the tunnelling probe, and a circuit for causing the voltage applying circuit to apply a first voltage to the tunnelling probe and for measuring a resulting tunnelling current that depends on the positional state of the memory element adjacent to the tunnelling probe. Finally, the apparatus includes a circuit for determining from the tunnelling current the digital state represented by the memory element adjacent to the tunnelling probe, and for providing the determined digital state as an output bit.

To write on the molecular memory medium, the apparatus may additionally comprise a circuit for receiving a digital bit to be stored on the molecular memory medium, and a circuit for causing the voltage applying circuit to apply a second voltage, greater than the first voltage, to the tunnelling probe when the digital bit is in a first state. The second voltage generates the electrostatic field to change the positional state of the memory element adjacent to the tunnelling probe to write the digital bit in the memory element.

Generally, digital data is written in the molecular memory medium by removing or repositioning atoms or molecules from the region either immediately above, on, or immediately below the surface of the molecular memory medium. The removing or repositioning force is applied by an electrostatic force. The digital data stored in the molecular memory medium is read by analyzing the tunneling current between the tunnelling probe and the surface of the molecular memory medium in conjunction with dynamically computed topological information relating to the disk surface to provide very high speed access to the stored data.

Most of the molecular memory media described herein also allow for re-planing of the memory surface, to provide more than a write-once capability.

The molecular memory medium can be any one of a large variety of materials. The present invention describes a number of different materials, and several different techniques for reading and writing the materials. The present invention allows for a large variety of materials to be used as the memory medium because the read/write head containing the tunnelling probe can fly above the relatively uneven surface of the medium at very high speeds.

DETAILED DESCRIPTION OF THE INVENTION

A. Molecular Memory Disk Drive Overview

Figure 1:
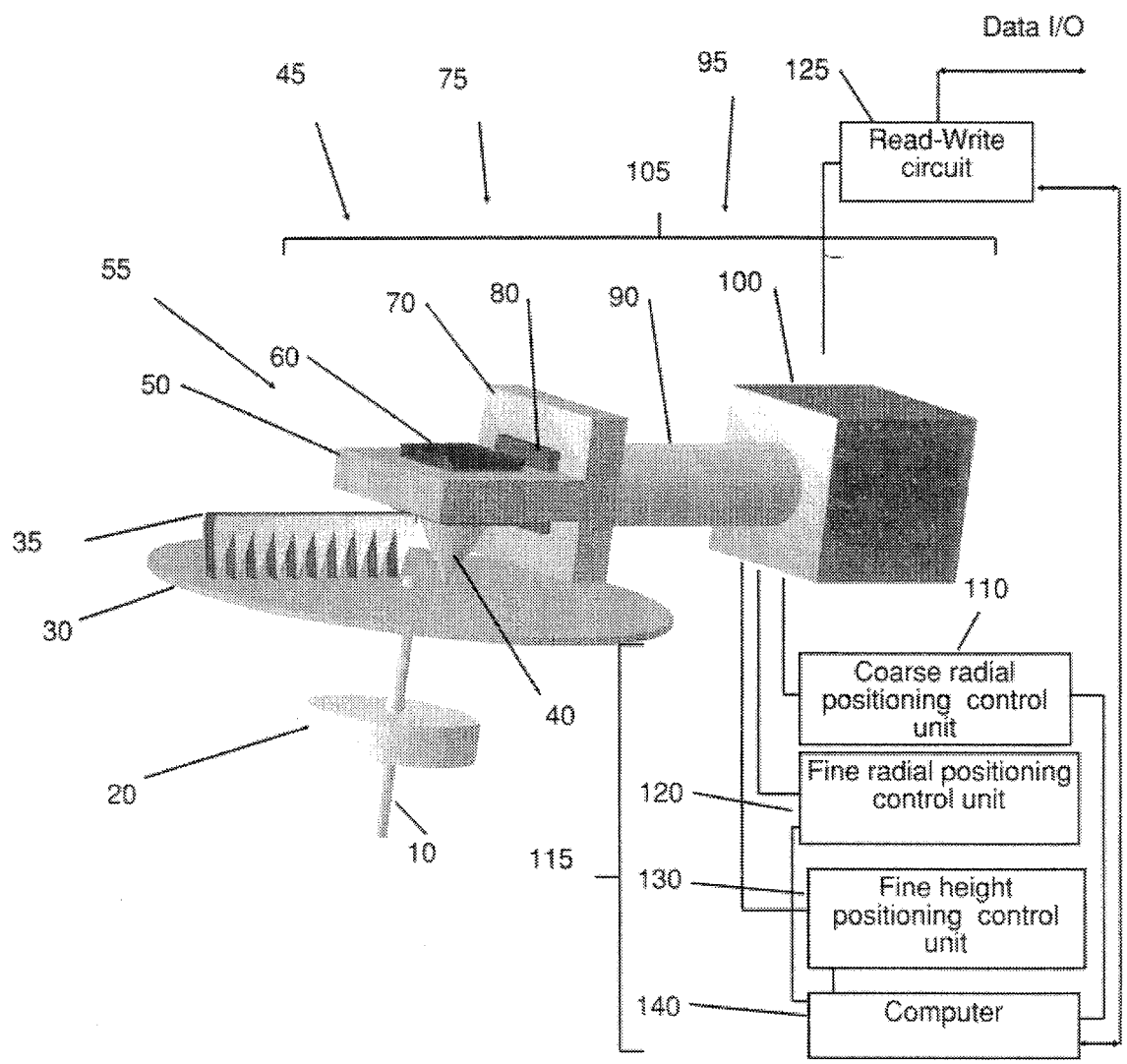
FIG. 1 shows a molecular disk drive apparatus according to the present invention utilizing a single tunnelling probe and a single disk memory surface.

Referring to FIG. 1, a molecular memory disk drive according to the present invention comprises a rotating molecular memory medium 30 comprising one or more disks, with a drive motor 20, an input/output section which comprises at least one tunnelling probe 40 facing the surface of the molecular memory medium, a positioning mechanism 100 for positioning the tunnelling probe above the molecular memory medium, a control circuit 110 for controlling the positioning mechanism, a sensing section which converts signals from the tunnelling probe into digital data, and vice versa, a cleaning section 35 which removes unwanted particles, a sharpening area where unwanted particles are removed and/or added to the tunnelling probe, and a tunnelling probe alignment section.

The control section brings the tunnelling probe close to the surface of the molecular memory medium to effect positioning, and can cause the tunnelling probe to scan the molecular memory medium. The control section also controls the distance between the tunnelling probe and the molecular memory medium during scanning, and positions the tunnelling probe above or below the surface of the molecular memory medium. The tunnelling probe or tunnelling probes are positioned relative to the surface of the molecular memory medium such that a tunneling current flows between the tunnelling probe and the molecular memory medium surface. The amount of this tunneling current indicates the distance between the tunnelling probe and the molecular memory medium.

B. Molecular Memory Media

In the following descriptions, various embodiments of the molecular memory medium according to the invention will first be described, followed by descriptions of a molecular disk drive apparatus. In the following descriptions, to store binary bits having a zero logical state and a one logical state, the positional state of memory element containing at least one atom or molecule in the molecular memory medium is left unchanged to represent a bit in one logical state, and the positional state of the memory element in the molecular memory medium is changed to represent a bit in the other logical state. For the sake of simplicity in the following descriptions, the positional state of the memory element will be left unchanged to represent a bit in the one logical state, and the positional state of the memory element will be changed to represent a bit in the zero logical state. The opposite convention could equally well be applied. Also, to simplify the following description, the word "atom," when used to denote the memory element, will mean atom or molecule.

Figure 12:
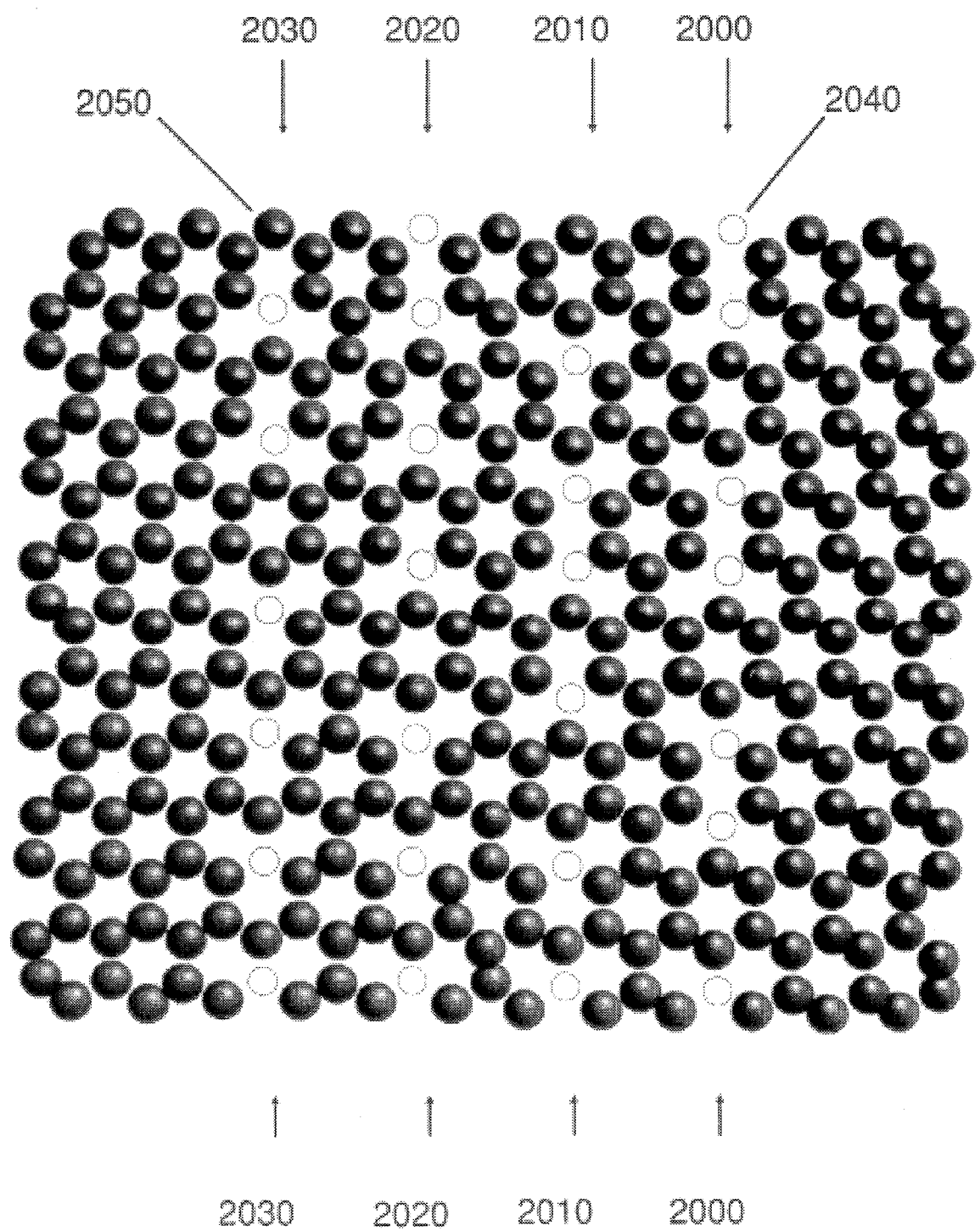
FIG. 12 shows portions of tracks on the surface of a molecular memory medium according to the invention.

In each of the embodiments, each bit is stored in a domain containing a memory element. Successive domains, and hence successive memory elements, are arranged along a track. For example, FIG. 12 shows a portion of the surface of a molecular memory medium containing parts of 4 tracks of NRZ-encoded binary data. This model was derived from a Hyperchem simulation using the Amber force model of two planes of carbon atoms in a graphite structure at 300 degrees Kelvin. Only the top plane of atoms is shown in this figure. The 4 tracks, 2000, 2010, 2020, and 2030, are separated from one another by 3 rows of carbon atoms, or 5 Ångstroms, and each domain along the track is separated by about 3 carbon atoms, or 5 Ångstroms. This separation provides sufficient stability to the surface to prevent the ring bond structure collapsing in the area between the tracks and to retain the information written by the write process. In FIG. 12, a bit in the zero state is represented by the absence of a carbon atom, depicted by an open circle, such as the open circle 2040. A bit in the one state is represented by the existence of a carbon atom, depicted by a shaded circle, such as the shaded circle 2050.

1. Molecular Memory Medium—First Embodiment

In this embodiment, the recording layer is a regular, flat surface, for example, graphite, with covalently-bonded atoms such as hydrogen atoms.

This molecular memory medium, depicted in FIGS. 2A, 2B and 2C, may be used in any one of the embodiments of the molecular memory disk drive described below. The molecular memory medium includes the recording layer which is, for example, an array of carbon atoms, such as the carbon atom 210, arranged in a graphite structure. The graphite structure consists of plural planes of carbon atoms, such as the surface plane 230, and the adjacent plane 240. In each domain in the recording layer, such as the domain 250, at least one hydrogen atom, such as the hydrogen atom 220, acts as the memory element. Each hydrogen atom acting as a memory element is covalently bonded to a group of adjacent carbon atoms. Successive domains are arranged along a track on the surface of the molecular memory medium.

Figure 2A:
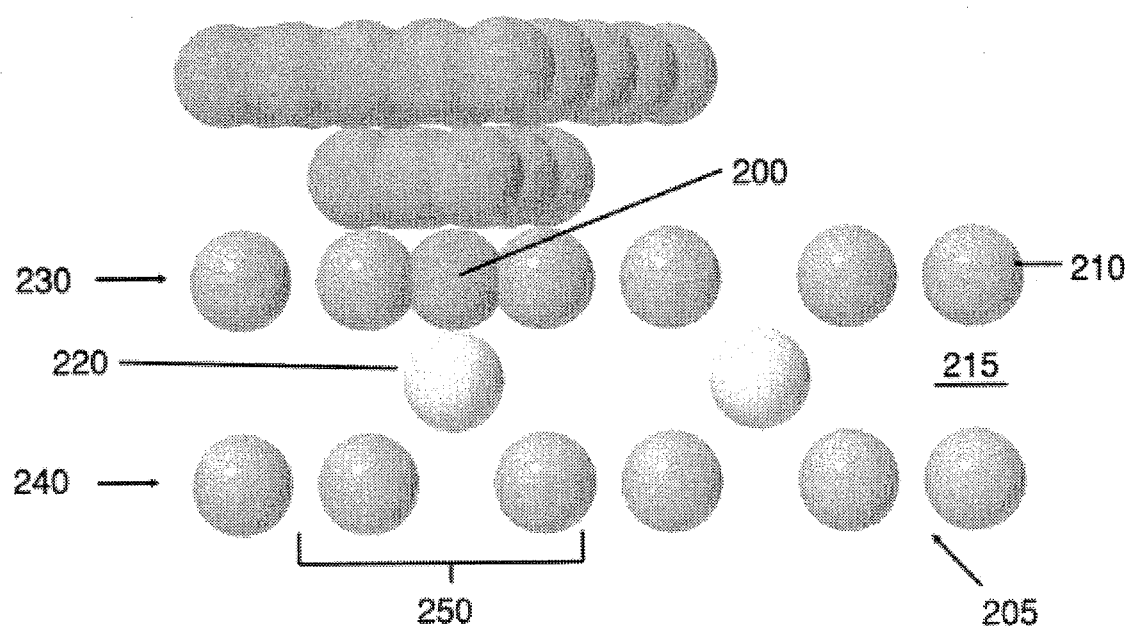
FIGS. 2A, 2B and 2C schematically show an enlarged view of two of the states of the first embodiment of the molecular memory medium according to the invention.

FIG. 2A depicts the procedure for mechanically erasing the memory. To place the memory element in the erased state, the tunnelling probe 200 is positioned so its most distal point is below the surface plane 210. The probe pushes the atom 220 below the surface plane 230. After the probe has passed the position of the atom 220, bonds between the atom 220 and the adjacent carbon atoms in the surface plane retain the atom 220 in position below the surface plane.

Alternatively, as part of the process of manufacturing the disk surface, the atom 220 can be fired at a high enough energy from above the surface plane 230 to penetrate the top layer of molecules, after which the atom 220 remains trapped under the surface plane. This pre-loads the memory disk in the formatted or erased state.

Figure 2B:
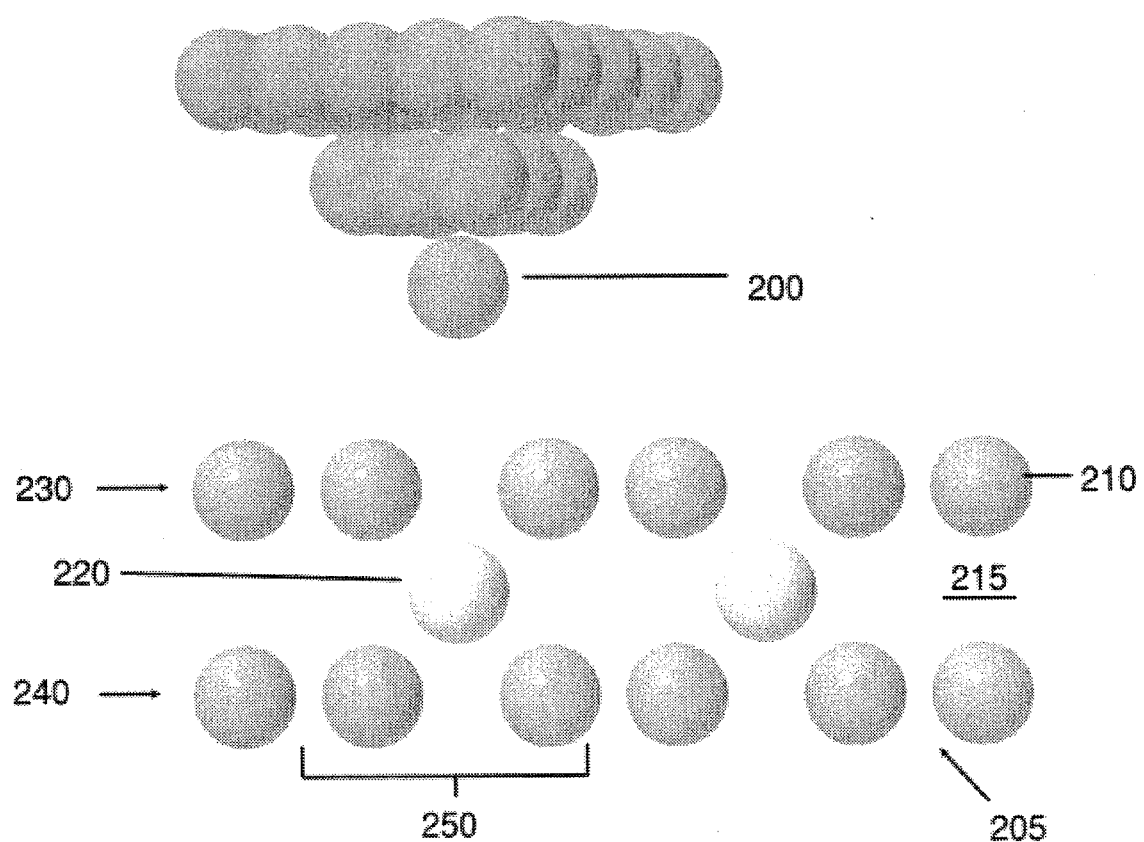

FIG. 2B depicts the molecular memory medium in the erased state and the tunnelling probe 200 in the read/write position.

Figure 2C:
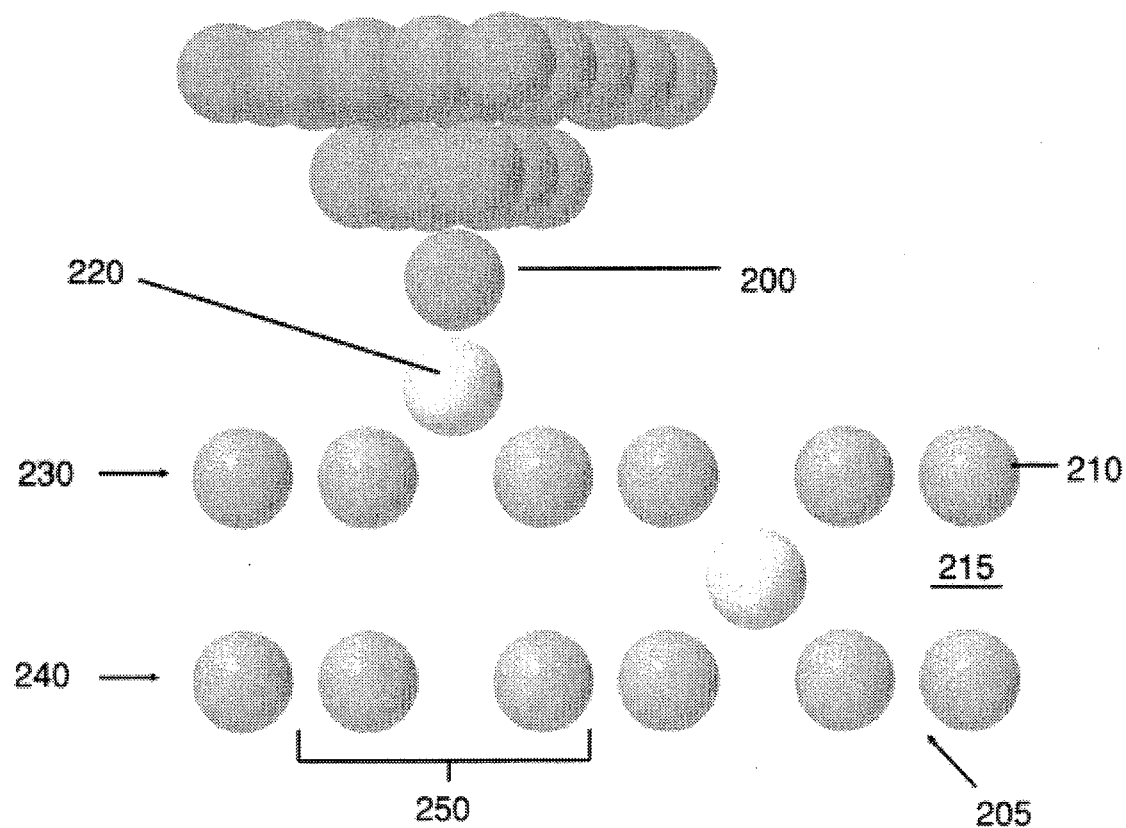

FIG. 2C illustrates writing a bit of data in the domain 250 containing the atom 220. If the bit of data being written is in the one state, the write system does nothing, and the domain is left in its erased state. If the bit of data being written is in the zero state, the write system applies an electrostatic force to the domain 250 to change the positional state of the atom 220.

To write a bit in the zero state into the domain 250, the tunnelling probe 200 is positioned above the surface plane 230 in the domain 250, close enough for tunneling to take place. Before the positional state of the domain is changed, the tunneling current between the tunnelling probe and the molecular memory medium is monitored and is used to maintain the tunnelling probe at a known height above the surface plane, and out of contact with the surface plane. Since the write system is inoperative while, bits in the one state are being written, the height of the tunnelling probe is adjusted by monitoring the tunnelling current while bits in the one state are being written. This greatly speeds up the writing process.

When the tunnelling probe 200 is in the correct position relative to the domain 250, a bias voltage, greater than that used to cause the tunnelling current, is applied between the tunnelling probe and the molecular memory medium. The bias voltage applies an electrostatic field to the atom 220 which attracts the atom. If the bias voltage is sufficiently high, it pulls the atom 220 into a position above the surface plane 230 such that the atom projects above the surface plane. The atom is retained in this position by bonds between it and the adjacent atoms in the surface plane. After the probe has passed the domain 250 due to rotation of the disk, the memory atom 220 stays in position above the surface plane.

Later, when the domain 250 in the molecular memory medium is read by measuring a tunnelling current between the tunnelling probe 200 and the molecular memory medium, the tunnelling current measured for the domain 250 will depend on the position of the atom 220. If the positional state of the atom 220 has been changed so that the atom projects above the surface plane 230, the tunnelling current will be greater than if the atom 220 had been left in place below the surface plane. Measuring the tunnelling current allows the positional state of the atom 220 to be determined.

2. Molecular Memory Medium—Second Embodiment

In this embodiment, the recording layer is a regular, flat surface, for example, graphite with embedded atoms such as helium atoms with little or no covalent bonding.

This molecular memory medium, depicted in FIGS. 3A, 3B, and 3C, may be used in any one of the embodiments of the molecular memory disk drive described below. The molecular memory medium includes the recording layer, which is, for example, an array of carbon atoms, such as the carbon atom 1310, arranged in a graphite structure. The graphite structure consists of plural planes of carbon atoms, such as the surface plane 1330, and the adjacent plane 1340. In each domain of the recording layer, such as the domain 1350, at least one atom, such as the helium atom 1320, acts as the memory element. The at least one atom of the memory element is trapped between the adjacent layers of carbon atoms with little or no covalent bonding. Successive domains, and hence successive memory elements, are arranged along a track on the surface of the molecular memory medium.

Figure 3A:
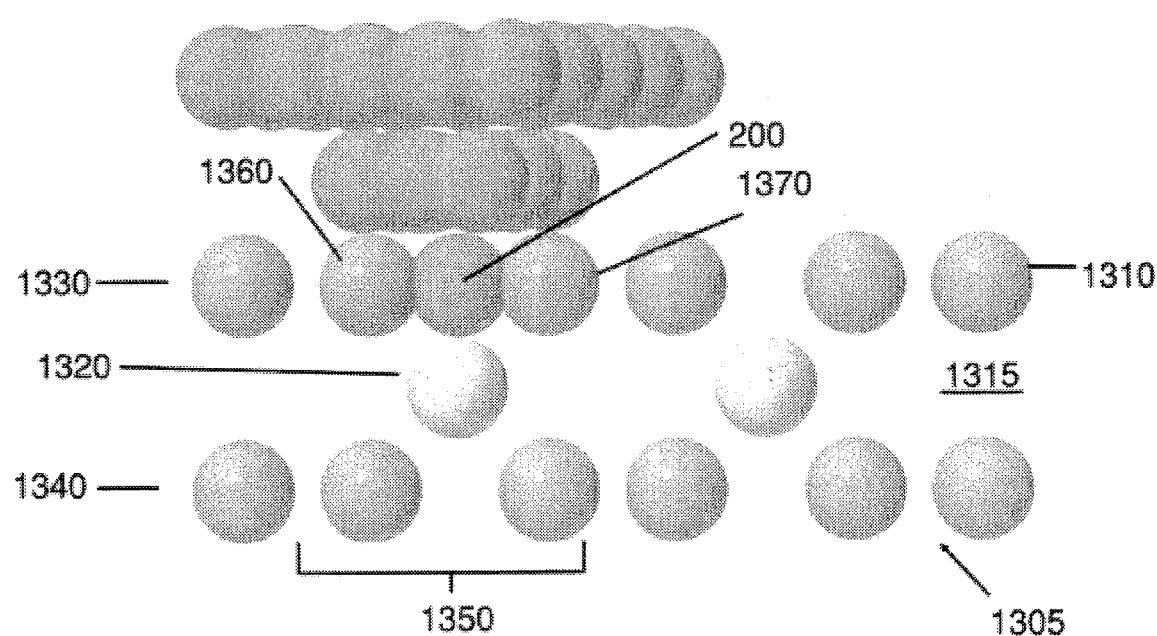
FIGS. 3A, 3B, and 3C schematically show an enlarged view of two of the states of the second embodiment of the molecular memory medium according to the invention.

FIG. 3A depicts a procedure for mechanically erasing the molecular memory medium. To place the molecular memory medium in the erased state, the tunnelling probe 200 is positioned so that its most distal point is below the surface plane 1330. The probe pushes the memory element, e.g., the helium atom 1320, below the surface plane 1330. After the tunnelling probe has passed the position of the atom 1320, the surrounding carbon atoms retain the atom 1320 in position below the surface plane.

Alternatively, as part of the process of manufacturing the disk, the atom 1320 can be fired at a high enough energy from above the surface plane 1330 to penetrate through the surface plane, after which the atom 1320 remains trapped under the surface plane. This pre-loads the memory element in the molecular memory medium in the formatted or erased state.

Figure 3B:
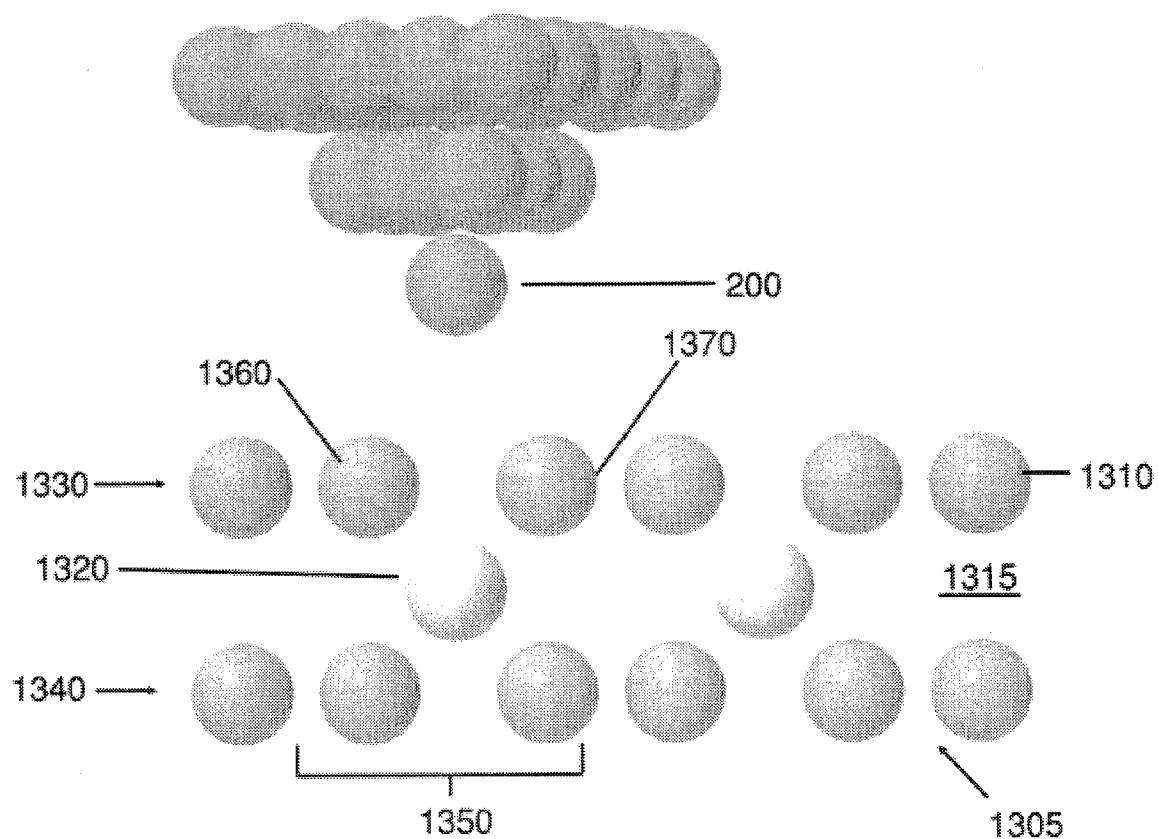

FIG. 3B depicts the molecular memory medium in the erased state and with the tunnelling probe 200 in the read/write position.

Figure 3C:
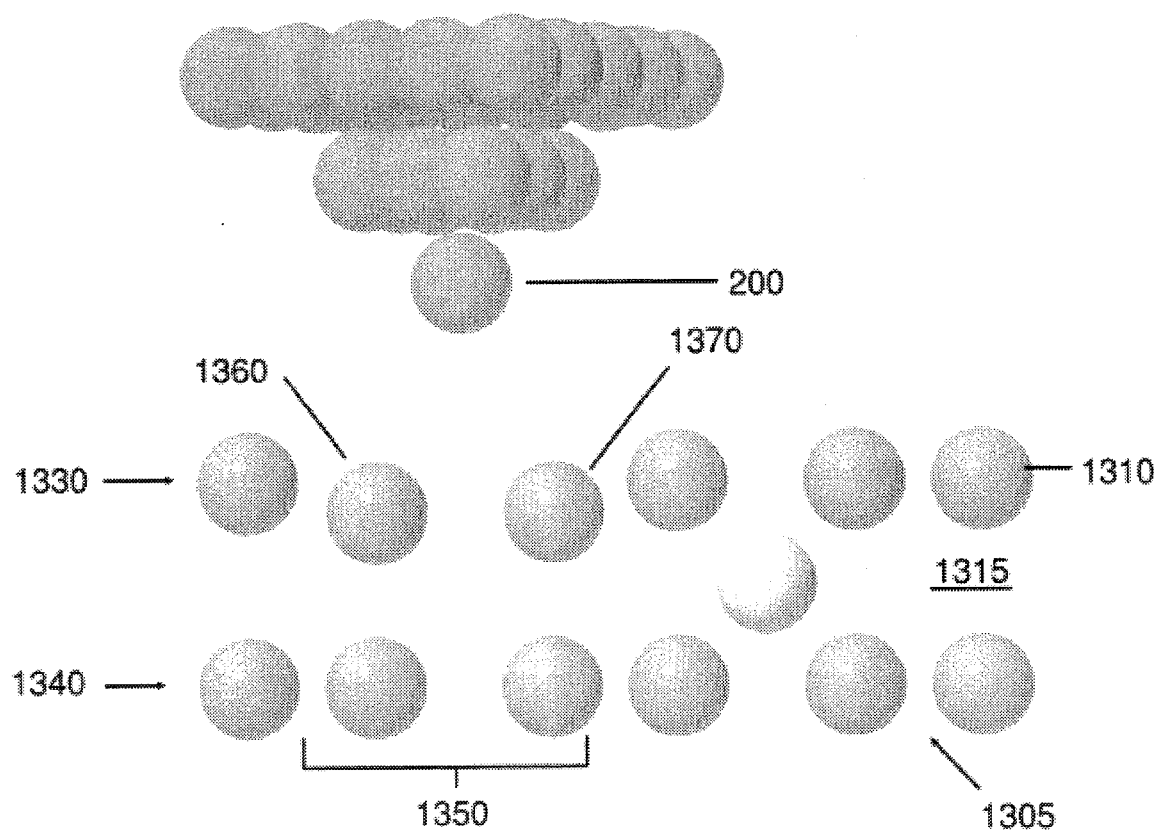

FIG. 3C illustrates writing a bit of data in the domain 1350 containing the memory element 1320. If the bit of data being written is in the one state, the write system does nothing, and the domain is left in its erased state. If the bit of data being written is in the zero state, the write system applies an electrostatic force to the domain 1350 to remove the memory element, e.g., the atom 1320. This changes the positional state of the atom 1320, and also of the atoms 1360 and 1370 in the surface layer 1330, adjacent to the former location of the atom 1320.

To write a bit in the zero state into the domain 1350, the tunnelling probe 200 is positioned above the surface plane 1330 in the domain 1350, close enough for tunnelling to take place. Before the positional state of the atoms in the domain 1350 is changed, the tunneling current between the tunnelling probe is monitored and is used to maintain the tunnelling probe at a known height above the surface plane, and out of contact with the surface plane. Since the write system is inoperative while bits in the one state are being written, the height of the tunnelling probe is adjusted by monitoring the tunnelling current while bits in the one state are being written. This greatly speeds up the writing process.

When the tunnelling probe 200 is in the correct position relative to the domain 1350, a bias voltage, greater than the voltage used to cause the tunnelling current, is applied between the tunnelling probe and the molecular memory medium. The bias voltage attracts the atoms of the molecular memory medium, and, if the voltage is sufficiently high, it pulls the atom 1320 out from under the surface plane 1330, and detaches the atom 1320 from the molecular memory medium.

FIG. 3C shows the domain 1350 with a zero state written therein. The atom 1320 has been removed from its position trapped between the adjacent planes of carbon atoms 1330 and 1340. The void in the structure left by the detached atom 1320 causes the atoms in the surface layer 1330, such as the atoms 1360 and 1370, adjacent to the former location of the atom 1320 to cave inwards, causing a depression in the surface plane 1330.

Later, when the domain 1350 in the molecular memory medium is read, a change in the tunnelling current between the tunnelling probe 200 and the molecular memory medium will detect the void left by removing the atom 1320. The tunnelling current measured for the domain 1350 will depend on the positional state of the atoms 1360 and 1370, which, in turn, depends on the positional state of the atom 1320. If the positional state of the atoms 1360 and 1370 has been changed by removing the atom 1320, the tunnelling current will be less than if the atoms 1360 and 1370 were in their positional state corresponding to the atom 1320 being left in place below the surface plane. Measuring the tunnelling current allows the positional state of the atoms 1320, 1360 and 1370 to be determined. Alternatively, the void left by the removed atom 1320 alters the tunneling characteristics of the surface layer as sensed by the tunnelling probe.

3. Molecular Memory Medium—Third Embodiment

In this embodiment, the recording layer is a regular, flat surface, for example, graphite.

This molecular memory medium, depicted in FIGS. 4A and 4B, may be used in any one of the embodiments of the molecular memory disk drive described below. The molecular memory medium includes the recording layer which is an array of carbon atoms, such as the carbon atom 1510, arranged in a graphite structure. The graphite structure consists of plural planes of carbon atoms, such as the surface plane 1530, and the adjacent plane 1540. The recording layer includes the domain 1550 that includes the memory element provided by at least one carbon atom, such as the carbon atoms 1520 and 1522. Successive domains, i.e., successive memory elements, are arranged along a track on the surface of the molecular memory medium.

Figure 4A:
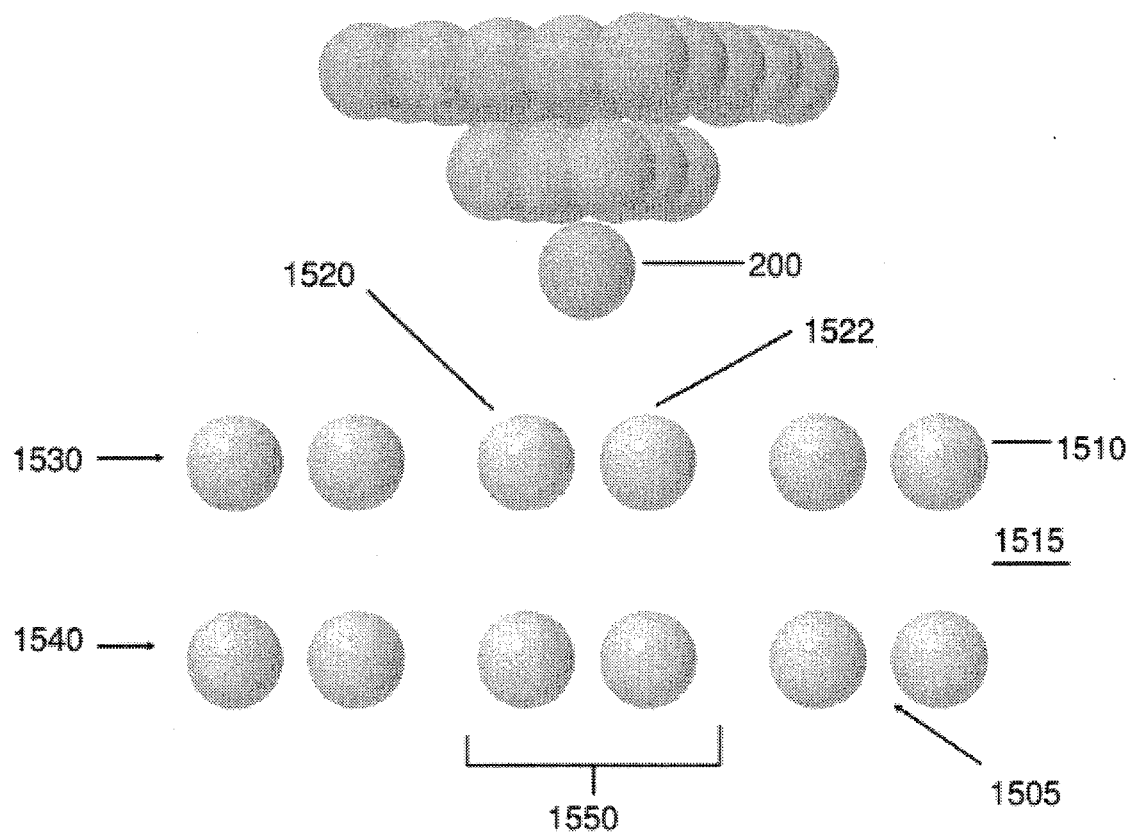
FIGS. 4A and 4B schematically show an enlarged view of two of the states of the third embodiment of the molecular memory medium according to the invention.

The molecular memory medium is depicted in its unwritten state in FIG. 4A.

Figure 4B:
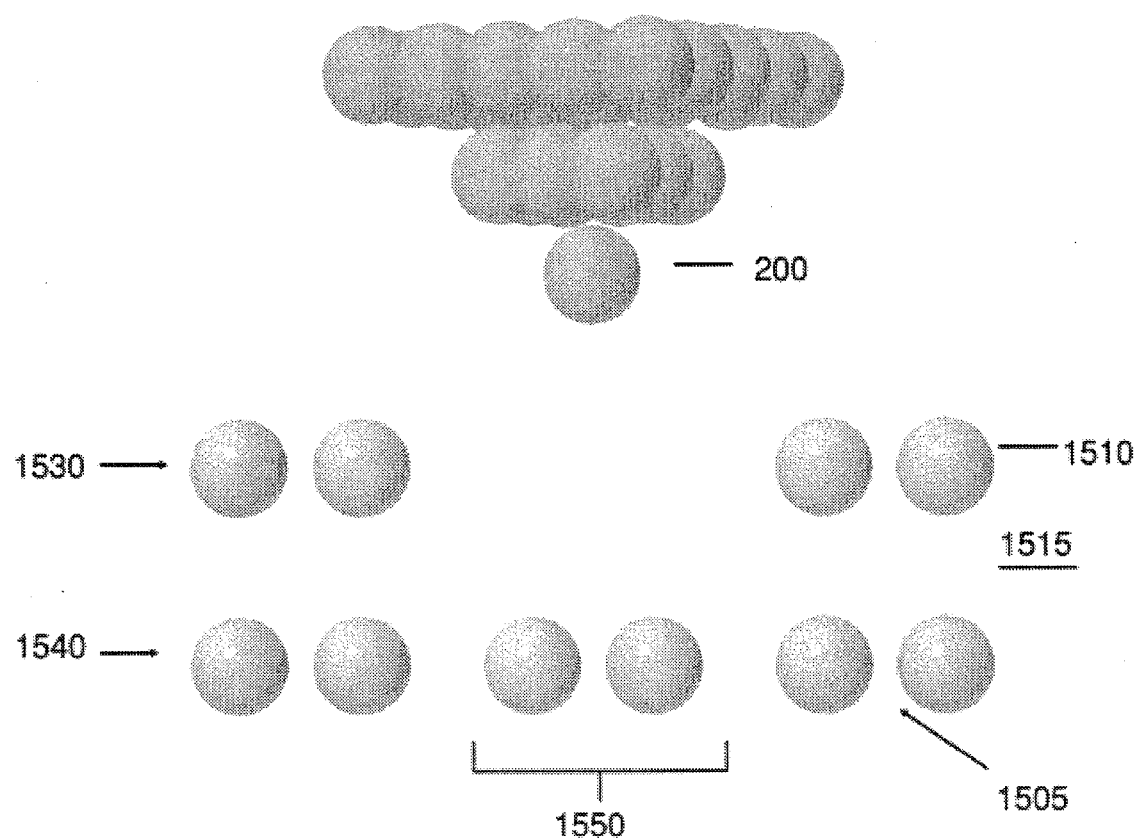

FIG. 4B illustrates writing a bit of data in the domain 1550. If the bit of data being written is in the one state, the write system does nothing, and the domain is left in its erased state. If the bit of data being written is in the zero state, the write system applies an electrostatic force to the domain 1550 to remove the memory element provided by the atoms 1520 and 1522 from the surface layer 1530 in the domain 1550, and hence to change the positional state of the memory element.

To write a bit in the zero state into the domain 1550, the tunnelling probe 200 is positioned above the surface plane 1530 in the domain 1550, close enough for tunnelling to take place. Before the positional state of the atoms in the domain 1550 is changed, the tunneling current between the tunnelling probe is monitored and is used to maintain the tunnelling probe at a known height above the surface plane, and out of contact with the surface plane.

When the tunnelling probe 200 is in the correct position relative to the domain 1550, a bias voltage, greater than the voltage used to cause the tunnelling current, is applied between the tunnelling probe and the molecular memory medium. The bias voltage attracts the atoms of the surface layer 1530, and, if the voltage is sufficiently high, it detaches the atoms 1520 and 1522 away from the surface plane 1530, as shown in FIG. 4B.

Later, when the domain 1550 in the molecular memory medium is read, a change in the tunnelling current between the tunnelling probe 200 and the molecular memory medium will detect the void left by removing the atoms 1520 and 1522. The tunnelling current measured for the domain 1550 will depend on the positional state of the atoms 1520 and 1522. If the positional state of the atoms 1520 and 1522 has been changed by removing them, the tunnelling current will be less than if the atoms 1520 and 1522 were in their original positional state in the surface plane 1530. Measuring the tunnelling current allows the positional state of the atoms 1520 and 1522 to be determined.

The molecular memory medium may be used as a read/write medium by re-formatting the surface of the medium. The tunnelling probe is passed over the surface layer in which data has been written with a constant bias voltage applied to the prove. This removes all of the surface layer, and exposes a new surface layer in which data can be written by selectively removing atoms from the surface layer, as described above. This procedure will be called re-planing the surface. Re-planing can be repeated until all of the layers of atoms or molecules have been removed from the disk.

4. Molecular Memory Medium—Fourth Embodiment

In this embodiment, the recording layer comprises a regular, flat surface, such as graphite, with a layer of rotationally asymmetrical molecules, such as cyclohexene or cytosine molecules.

This molecular memory medium, depicted in FIGS. 5A through 5D, may be used in any one of the disk drive apparatus 1 through 10 described below. The molecular memory medium includes the recording layer which is an array of carbon atoms, such as the carbon atom 462, arranged in a graphite structure 464, similar to that shown in FIG. 4A. Formed on the surface of the graphite structure is a monomolecular layer of rotationally asymmetrical molecules. The rotationally asymmetrical molecules in the monomolecular layer are lightly bonded to the underlying carbon atoms, but not to one another. Accordingly, the rotationally asymmetrical molecules in the monomolecular layer can independently rotate from one stable positional state to another positional state to provide a change of positional state.

One or more rotationally asymmetrical molecules in the monomolecular layer provides the memory element in each domain of the recording medium. Successive domains are arranged along a track on the surface of the molecular memory medium.

Figure 5A:
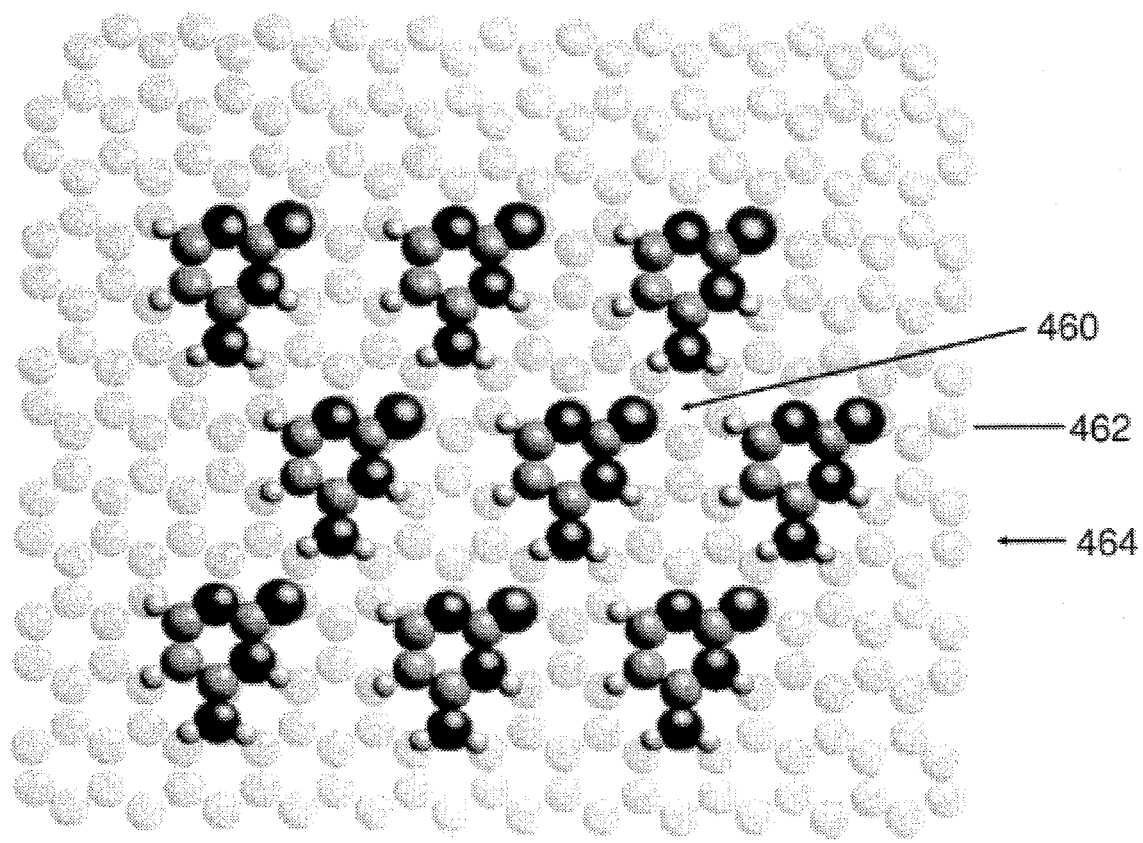
FIGS. 5A and 5B schematically show an enlarged view of two of the states of the fourth embodiment of the molecular memory medium according to the invention in which the memory molecule rotates about the z-axis.
Figure 5B:
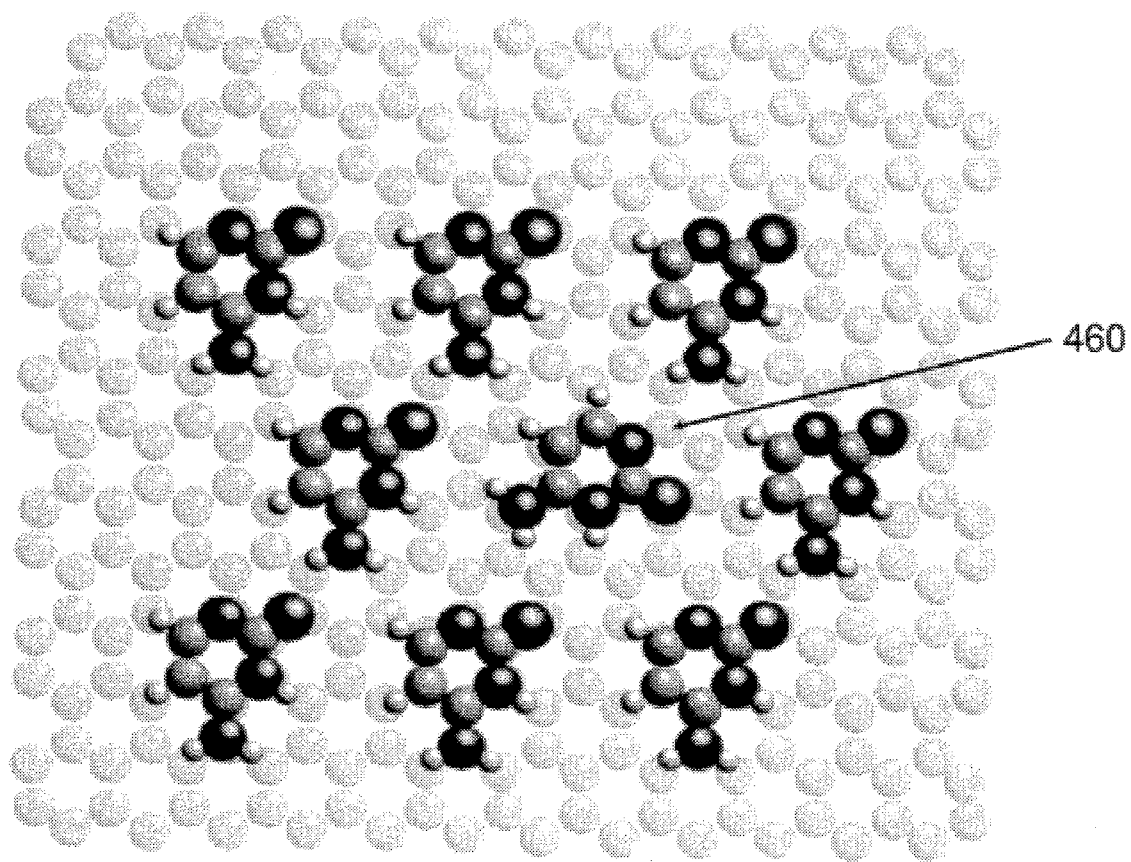

FIGS. 5A and 5B show an example in which the rotationally asymmetrical molecule rotates about the z-axis, i.e., the axis that runs perpendicular to the plane of the drawing. Molecules having a suitably substituted benzene ring on a graphite substrate have six stable rotational positions about the z-axis, and can therefore be used as memory molecules. Molecules in which the same substituent is used in five of the six positions on the ring and a different substituent is used in the sixth position on the ring can have six distinguishable rotational states. The rotational states of the molecule can be distinguished from one another by comparing the tunnelling current pattern with known tunnelling current patterns corresponding to each rotational state. A molecule with more than one different substituent, such as cytosine, asymmetrically placed on the ring, also has six distinguishable rotational states. A molecule with the same substituent, symmetrically placed in two positions on the ring, has three distinguishable rotational states. A molecule with the same substituent, symmetrically placed in three positions on the ring, has two distinguishable rotational states FIG. 5A shows the rotationally asymmetrical cytosine molecule 460 in a domain in its unwritten state. If the bit of data being written is in the one state, the write system does nothing, and the molecule is left in its unwritten state. If the bit of data being written is in the zero state, the write system applies a off-center electrostatic force to the rotationally asymmetrical molecule 460, which causes the molecule to rotate to the next stable rotational position on the graphite structure 464, thereby changing the positional state of the rotationally asymmetrical molecule 460.

To write a bit in the zero state into the domain, the tunnelling probe is positioned above the surface plane in the domain, close enough for tunnelling to take place. Before the positional state of the rotationally asymmetrical molecule 460 in the domain is changed, the tunneling current between the tunnelling probe is monitored and is used to maintain the tunnelling probe at a known height above the surface plane, and out of contact with the surface plane. Since the write system is inoperative while bits in the one state are being written, the height of the tunnelling probe is adjusted by monitoring the tunnelling current while bits in the one state are being written. This greatly speeds up the writing process.

When the tunnelling probe is in the correct position relative to the domain, a bias voltage, greater than the voltage used to cause the tunnelling current, is applied between the tunnelling probe and the molecular memory medium. The bias voltage attracts part of the rotationally asymmetrical molecule 460, and, if the voltage is sufficiently high, it pulls the molecule out of its original rotational position on the graphite structure 464 in such way as to rotate the rotationally asymmetrical memory element to the next stable rotational state, as depicted in FIG. 5B. The resulting changed positional state of the rotationally asymmetrical molecule represents a data bit in the zero state.

If the rotationally asymmetrical molecule 460 has more than two rotational states, plural bits can be represented by a single domain.

When the molecular memory medium is read, the positional state of the rotationally asymmetrical molecule 460 is detected using the tunnelling effect by comparing the signal pattern read by passing the tunnelling probe over the rotationally asymmetrical molecule to the signal pattern of known rotational states.

This embodiment of the molecular memory medium has the advantage of being capable of repeated changes in positional state, thus making it a re-writable memory. It furthermore does not need the cleaning particulate filter, to be described below, because no atoms are removed from the surface. However, the cleaning particulate filter is still useful for removing contaminant particles, and therefore may still be used.

The molecular memory medium can also use rotationally asymmetrical molecules that have different positional states distinguished by rotation about the x-axis or the y-axis. For example, a monomolecular layer of cyclohexene, or some other suitable elongate, helical, rotationally asymmetrical molecule formed on the surface of a substrate 404 of graphite or some other suitable material can be used. Each rotationally asymmetrical molecule provides a domain of the molecular memory medium. Successive domains are arranged along a track on the surface of the molecular memory medium. The molecules are deposited on the surface of the substrate so that their long axes is aligned with the track direction, indicated, for example, by the arrows 406 and 408, and so that their longer transverse axes are parallel to the surface of the substrate, as shown in FIG. 5C.

Figure 5C:
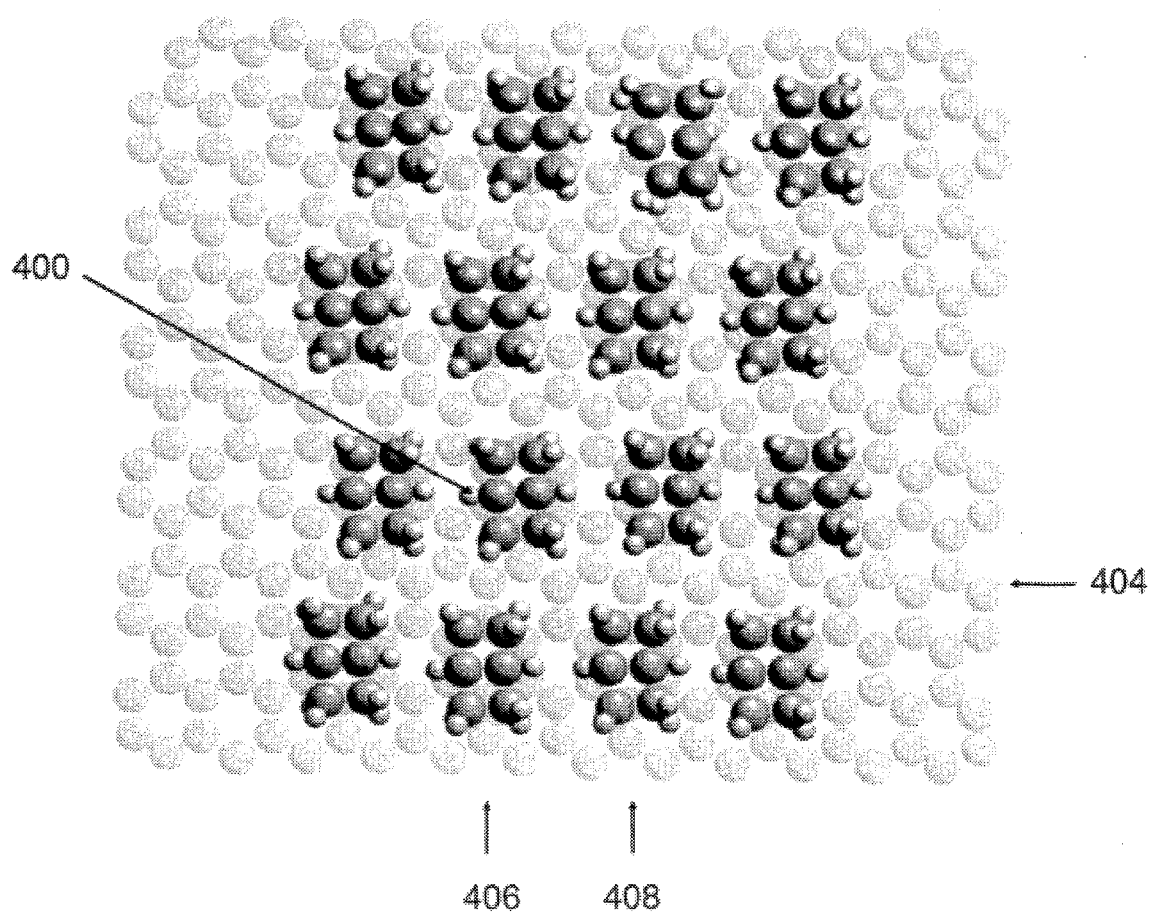
FIGS. 5C and 5D schematically show an enlarged view of two of the states of the fourth embodiment of the molecular memory medium according to the invention in which the memory molecule rotates about the y-axis.

FIG. 5C shows the cyclohexene molecule 400 in a domain in its unwritten state. If the bit of data being written is in the one state, the write system does nothing, and the cyclohexene molecule is left in its unwritten state. If the bit of data being written is in the zero state, the write system applies an electrostatic force to the cyclohexene molecule 400 to rotate the cyclohexene molecule to the position shown in FIG. 5D, thereby changing the positional state of the cyclohexene molecule 400.

To write a-bit in the zero state into the domain, the tunnelling probe is positioned above the surface plane in the domain, close enough for tunnelling to take place. Before the positional state of the cyclohexene molecule 400 in the domain is changed, the tunneling current between the tunnelling probe is monitored and is used to maintain the tunnelling probe at a known height above the surface plane, and out of contact with the surface plane. Since the write system is inoperative while bits in the one state are being written, the height of the tunnelling probe is adjusted by monitoring the tunnelling current while bits in the one state are being written. This greatly speeds up the writing process.

Figure 5D:
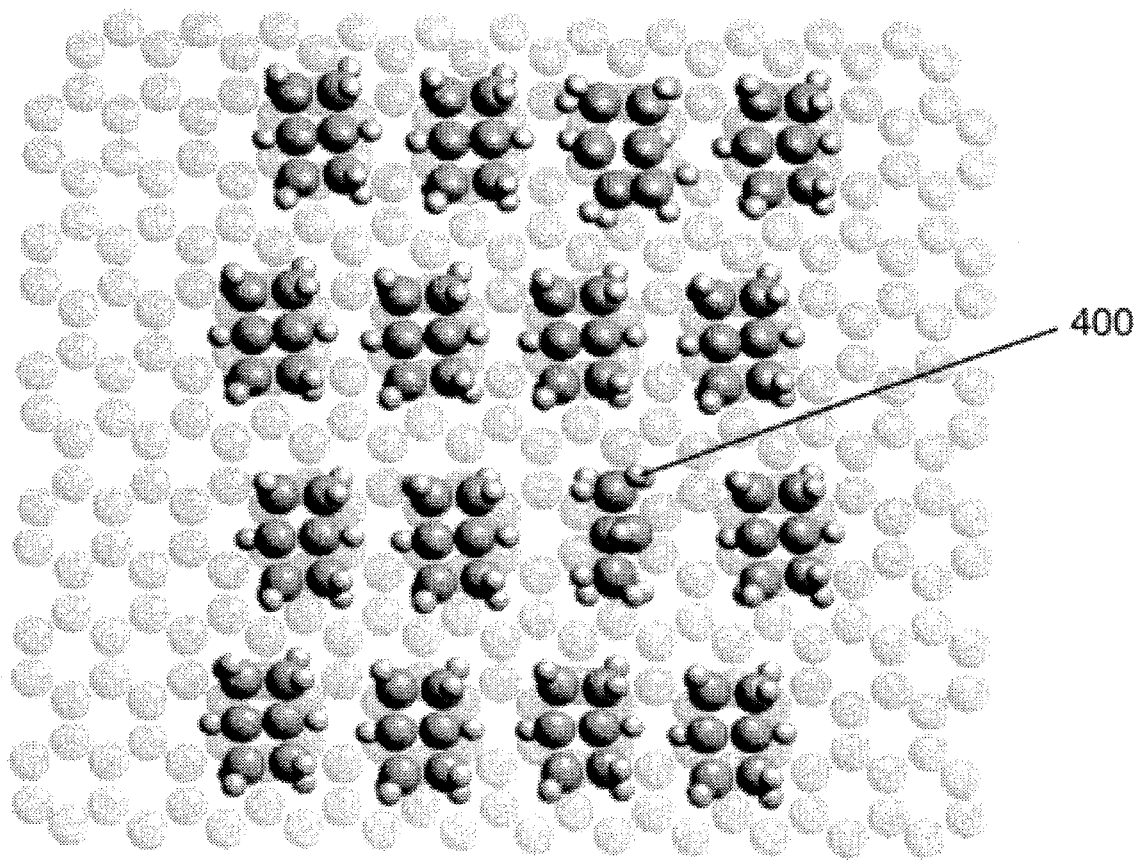

When the tunnelling probe is in the correct position relative to the domain, a bias voltage, greater than the voltage used to cause the tunnelling current, is applied between the tunnelling probe and the molecular memory medium. The bias voltage attracts the cyclohexene molecule 400, and, if the voltage is sufficiently high, rotates the cyclohexene molecule through about 90 degrees about the y-axis so that the longer transverse axis of the molecule is perpendicular to the surface of the substrate, as shown in FIG. 5D. The resulting changed positional state of the cyclohexene molecule represents a data bit in the zero state.

When the molecular memory medium is read, the positional state of each molecule is detected using the tunnelling effect by comparing the signal pattern read by passing the tunnelling probe over the memory molecule to the signal pattern of known states. There may exist more than two rotational states of the memory molecule, in which case, more than one bit can be stored in each domain.

This embodiment of the molecular memory medium has the advantage of being capable of repeated changes in positional state, thus making it a re-writable memory. Applying a bias voltage to a molecule in the zero state will rotate the molecule through another about 90 degrees about the y-axis to return the molecule to the one state.

This embodiment of the molecular memory medium additionally has the advantage of not needing the cleaning particulate filter, to be described below, because no atoms are removed from the surface. However, the cleaning particulate filter is still useful for removing contaminant particles, and therefore may still be used.

5. Molecular Memory Medium—Fifth Embodiment

In this embodiment, the recording layer is a group IV element, such as silicon, with an impurity of a group III or group V element, such as phosphorus, arsenic, or boron.

This molecular memory medium, depicted in FIGS. 6A and 6B, may be used in any one of the embodiments of the molecular memory disk drive described below. The molecular memory medium includes the recording layer, which is an array of silicon atoms, such as the silicon atom 1710, arranged in a lattice. In each domain, such as the domain 1750, at least one impurity atom, such as the impurity atom 1720, replaces one of the silicon atoms and acts as the memory element in the domain. Successive domains, and hence successive memory elements, are arranged along a track on the surface of the molecular memory medium.

Figure 6A:
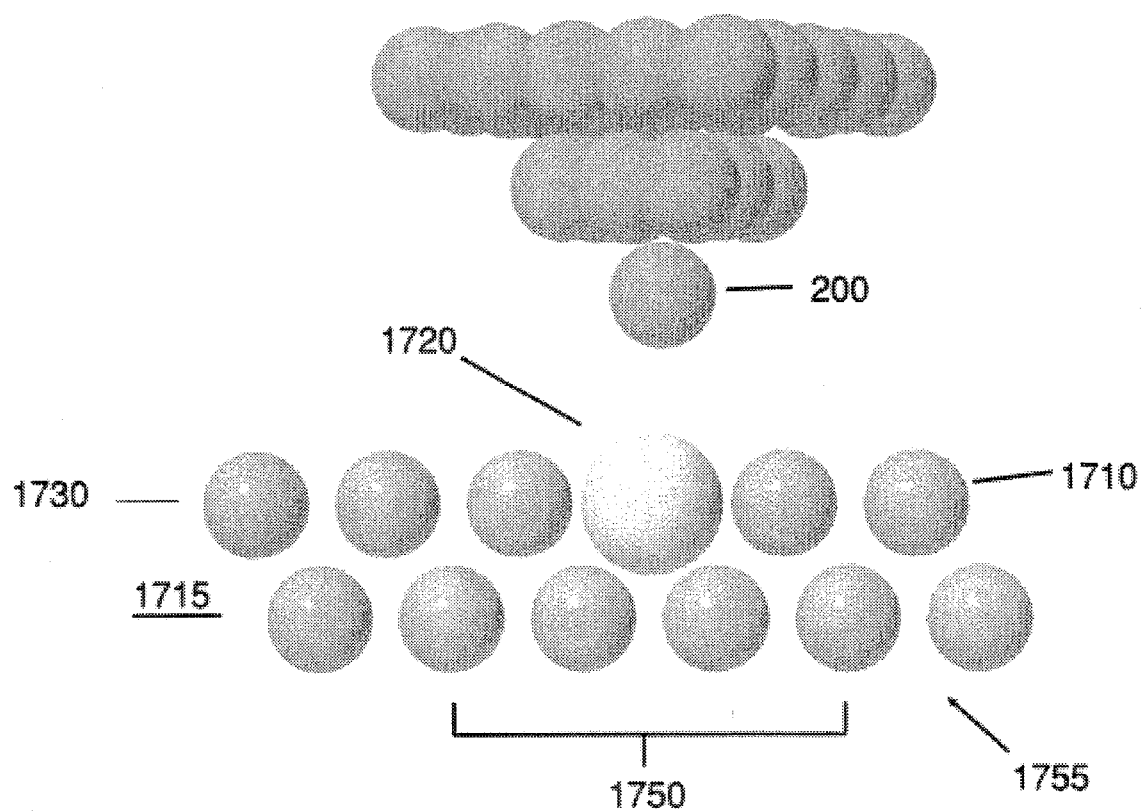
FIGS. 6A and 6B schematically show an enlarged view of two of the states of the fifth embodiment of the molecular memory medium according to the invention.

The molecular memory medium is depicted in its unwritten state in FIG. 6A.

Figure 6B:
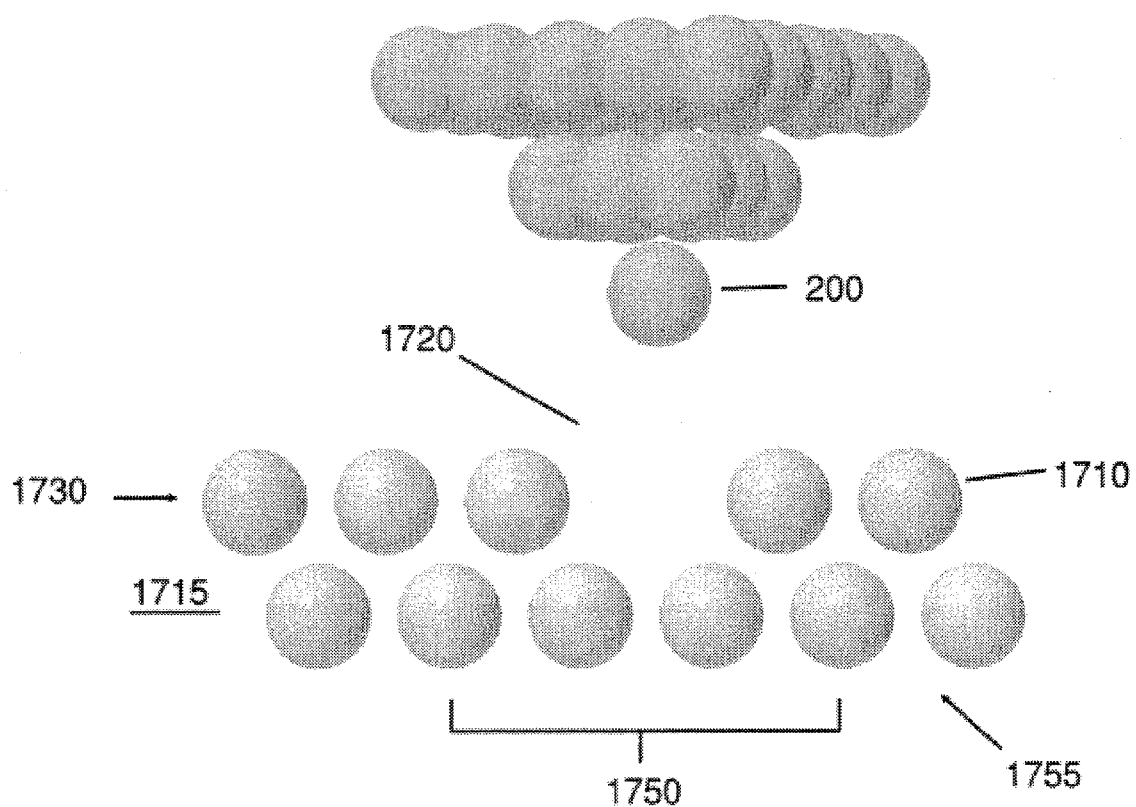

FIG. 6B depicts the molecular memory medium after a one-state bit has been written in the domain 1750. If the bit of data being written is in the one state, the write system does nothing, and the domain is left in its erased state. If the bit of data being written is in the zero state, the write system applies an electrostatic force to the domain 1750 to remove the impurity atom 1720, and thereby to change the positional state of the impurity atom 1720.

To write a bit in the zero state into the domain 1750, the tunnelling probe 200 is positioned above the surface plane 1730 in the domain 1750, close enough for tunnelling to take place. Before the positional state of the atom in the domain 1750 is changed, the tunneling current between the tunnelling probe is monitored and is used to maintain the tunnelling probe at a known height above the surface plane, and out of contact with the surface plane. Since the write system is inoperative while bits in the one state are being written, the height of the tunnelling probe is adjusted by monitoring the tunnelling current while bits in the one state are being written. This greatly speeds up the writing process.

When the tunnelling probe 200 is in the correct position relative to the domain 1750, a bias voltage, greater than the voltage used to cause the tunnelling current, is applied between the tunnelling probe and the molecular memory medium. The bias voltage attracts the atoms of the molecular memory medium, and, if the voltage is sufficiently high, it pulls the atom 1720 out from the surface plane 1730, and detaches the atom 1720 from the molecular memory medium.

FIG. 6B shows the domain 1750 with a zero state written therein. The impurity atom 1720 has been removed from the surface layer 1730, leaving a void.

When the domain 1750 in the molecular memory medium is read, a change in the tunnelling current between the tunnelling probe 200 and the molecular memory medium will detect the void left by removing the impurity atom 1720. The tunnelling current measured for the domain 1750 will depend on the positional state of the atom 1720. If the positional state of the atom 1720 has been changed by removing it, the tunnelling current will be less than if the atom 1720 were in its positional state in the surface plane. Measuring the tunnelling current allows the positional state of the atom 1320 to be determined.

This arrangement works similarly to Memory Technique 3, but the doped silicon surface provides a greater tunnelling current for a given height of the tunnelling probe than a graphite surface. This allows the separation between the tunnelling probe and the surface to be increased, and reduces the precision with which the height of the tunnelling probe must be controlled.

Alternately, removing the impurity atom changes the conductivity of the surface of the molecular memory medium in the domain. This change affects the value of the tunneling current, and therefore provides a way of detecting the existence or lack of impurity atoms in the domain.

6. Molecular Memory Medium—Sixth Embodiment

In this embodiment, the recording layer comprises a substrate of a molecule or element, such as silicon, overlaid with a monolayer of a different molecule or element, such as carbon. The monolayer overlays the substrate such that the monolayer conforms to the contours of the substrate. Accordingly, the monolayer has a structure different from the structure that it would have in bulk form.

This molecular memory medium, depicted in FIGS. 7A and 7B, may be used in any one of the embodiments of the molecular memory disk drive described below. The recording layer comprises a substrate 1910 of bulk silicon having a first lattice structure, such as a tetrahedral structure. Deposited on the surface of the substrate is a monatomic layer 1930 of carbon. The atoms, such as the atom 1920, in the carbon layer are arranged in a lattice different from that which they would form if they were part of bulk material. Each domain in the recording layer, such as the domain 1950, includes at least one carbon atom, such as the carbon atom 1920, as the memory element. Successive domains, and hence successive memory elements, are arranged along a track on the surface of the molecular memory medium.

Figure 7A:
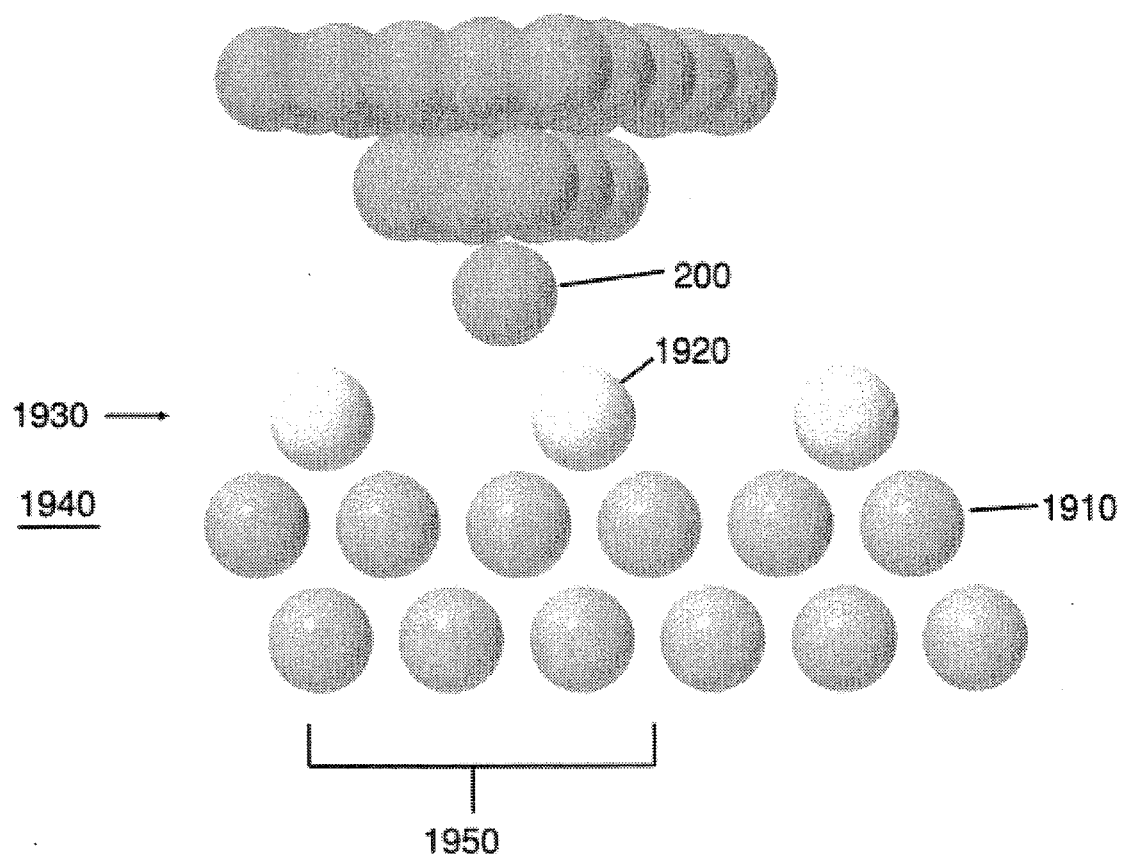
FIGS. 7A and 7B schematically show an enlarged view of two of the states of the sixth embodiment of the molecular memory medium according to the invention.
Figure 7B:
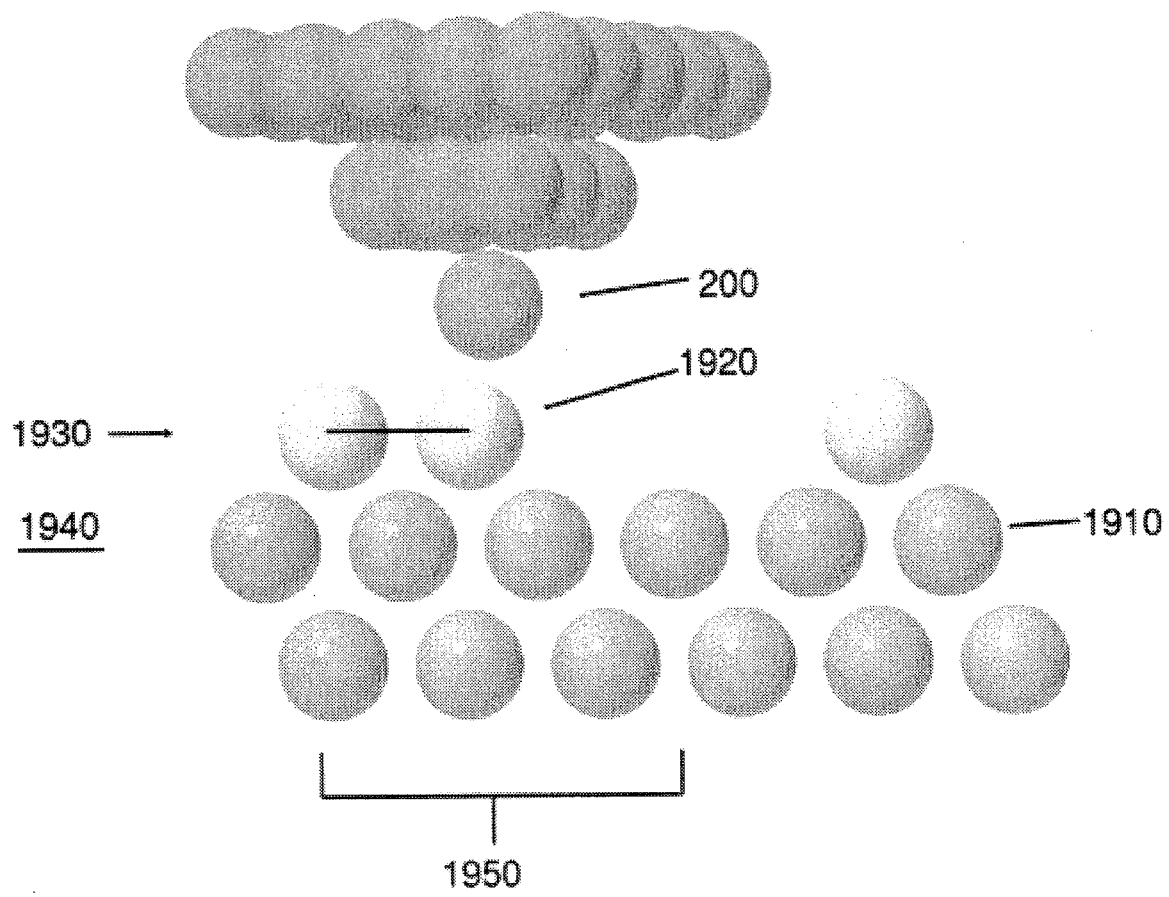

The molecular memory medium is depicted in its unwritten state in FIG. 7A.

When data is written in to the molecular memory medium, if the bit of data being written is in the one state, the write system does nothing, and the domain is left in its erased state. If the bit of data being written is in the zero state, the write system applies an electrostatic force to the domain 1950 to change the positional state of the atom 1920 on the surface layer 1940 of the substrate.

To write a bit in the zero state into the domain 1950, the tunnelling probe 200 is positioned above the surface of the carbon layer 1930 in the domain 1950, close enough for tunnelling to take place. Before the positional state of the atom in the domain 1950 is changed, the tunneling current between the tunnelling probe is monitored and is used to maintain the tunnelling probe at a known height above the surface plane, and out of contact with the surface plane. Since the write system is inoperative while, bits in the one state are being written, the height of the tunnelling probe is adjusted by monitoring the tunnelling current while bits in the one state are being written. This greatly speeds up the writing process.

When the tunnelling probe 200 is in the correct position relative to the domain 1950, a bias voltage, greater than the voltage used to cause the tunnelling current, is applied between the tunnelling probe and the molecular memory medium. The bias voltage attracts the atoms in the carbon layer 1930, and, if the voltage is sufficiently high, it pulls the carbon atom 1920 out of its original position on the surface 1940, and allows the carbon atom 1920 to reform in a different lattice structure, with a different positional state, as depicted in FIG. 7B.

This change in the lattice structure indicates that a bit in the zero state has been written in the domain 1950. When the domain 1950 in the molecular memory medium is read, a change in the tunnelling current between the tunnelling probe 200 and the molecular memory medium will detect the change in :the positional state of the atom 1920 manifested by the change in shape of the lattice structure. This is detected using the tunneling effect by comparing the signal pattern read by passing the tunnelling probe over the altered lattice structure to the signal pattern of the lattice structure prior to writing.

C. Molecular Memory Disk Drive—Common Features

The molecular memory media described above may be formed into various physical embodiments to enable data to be written on and read from the media. Since the data density is so high, memories storing less than, for example, 1 GByte, can be made using a small, flat, rectangular piece of molecular memory medium and a suitable mechanism to scan the surface of the medium with one or more tunnelling probes. Larger capacity drives can be made using flat, rectangular pieces of molecular memory medium, but are preferably made using disk-shaped or cylindrical pieces of molecular memory medium, which are then rotated to allow the tunnelling probe to follow the track. Various embodiments of an apparatus for writing to and reading from a molecular memory medium in the form of a single- or double-sided disk will next be described.

1. Molecular Memory Disk Drive—Basic Embodiment

FIG. 1 shows a molecular memory disk drive apparatus according to the present invention. The drive motor 20 rotates the molecular memory medium in the form of a molecular memory disk 30 via the coupling 10. The tunnelling probe 40 is positioned radially by a coarse radial positioner 95, consisting of the electromagnetic drive coil 100 driving the magnetically-movable arm 90, on which the head assembly 45 is mounted. The head assembly consists of a fine radial positioner 75 consisting of the piezoelectric transducer 70 with the electrodes 80, a fine height positioner 75 consisting of the piezoelectric transducer 50 with the electrodes 60, and the tunnelling probe 40.

The coarse radial positioner 95 moves the head assembly 45 parallel to the surface of the molecular memory disk. The fine radial positioner 75 also moves the head assembly parallel to the surface of the memory disk, and comprises the piezoelectric transducer 70 and the electrodes 80. A voltage applied to the electrodes 80 expands or contracts the piezoelectric transducer 70, and moves the head assembly radially at a fine resolution.

The fine height positioner 55 moves the head assembly 45 on an axis perpendicular to the surface of the molecular memory disk, and consists of piezoelectric transducer 50 with the electrodes 60. A voltage applied to the electrodes 60 expands or contracts the transducer 50, moving the tunnelling probe 40 perpendicular to the molecular memory disk at a fine resolution.

The coarse radial control unit 110, the fine radial control unit 120, and the fine height control unit 130 are controlled by the computer 140.

The motor 20 and coarse positioner 95 are attached to an antivibration mount (not shown). Attaching the spindle and disks to the antivibration mount reduces undesired movement of the disks. Attaching the coarse positioner to the antivibration mount reduces undesired movement of the coarse positioner.

2. Alignment of the Head Assembly

In the following description, a "track" is defined as the part of the molecular memory disk area under the circular path described on the surface of the molecular memory disk by the tunnelling probe as the disk rotates and the tunnelling probe is not moved radially. The domains in which the digital bits are stored are arranged sequentially along a track. The tracks may be concentric, as just defined, or the surface of the molecular memory disc may be occupied by one or more spiral tracks.

Alignment of the tunnelling probe relative to the tracks on the molecular memory disk is accomplished in two primary ways. The first way is to detect the lack of written information in the areas of the surface of the molecular memory disk between the tracks on which information is written. If the tunnelling probe portion strays radially from the track, variations in the tunnelling current, indicating the existence of changing states of data, will gradually diminish. The read electronics 125 sense the diminution in the variations in tunnelling current and feed a corrective signal to the fine radial control unit 120, which sends a corrective signal to the fine radial positioner 75 to correct the error in radial positioning.

In the second way of determining which track the tunnelling probe is positioned over, data bits are written at known locations along each track. The data bits define a unique track number and an optional sector address. The pattern of the track number with optional sector address is such that it is never repeated in the data part of the track. The track number and the optional sector address are read by the tunnelling probe 40 and the read electronics 125 and are fed back to the computer 140, which then applies corrective signals to the coarse and fine radial positioners 95 and 75, respectively, to move the tunnelling probe to the correct track.

In molecular memory disk drives for use with molecular memory disks that are not flat, it is necessary to use a two-stage height positioner (not shown). The two-stage positioner consists of a coarse height positioner consisting of a first piezoelectric transducer with electrodes, and a smaller fine height positioner consisting of a second piezoelectric transducer with electrodes, mounted between the coarse height positioner and the tunnelling probe. The coarse height positioner works as described above and compensates for a lack of flatness in the disk surface. The fine height positioner compensates for sharp steps in the disk surface, as will be described in the section entitled *Compensation for Surface Defects*, below. The lower mass of the smaller height positioner allows it to move more rapidly so that it can compensate for rapid changes in the effective height of the surface of the molecular memory disk.

3. Performing a Write Operation

To perform a write operation, the coarse and fine radial positioners 95 and 75, respectively, and their respective control units 110 and 120, are operated in the manner described above to position the tunnelling probe above the desired track. During this operation, the tunnelling probe 40 is in read mode, and senses track number, sector address, and data information. When the correct track with optional sector address has been reached, as read determined by track number and sector address read from the disk by the tunnelling probe, the tunnelling probe and the read/write electronics are switched to write mode. When in write mode, the bias voltage applied to the tunnelling probe is alternated between a sense read mode, where the bias voltage is low enough that no change is effected to the molecular memory surface, and a write mode, where the bias voltage is of sufficient intensity to effect a change in the memory surface.

During the sense read mode, the read/write electronics 125 read the tunnelling current between the tunnelling probe and the molecular memory medium. If the tunnelling current increases, this indicates the tunnelling probe is moving closer to the surface of the molecular memory medium. Conversely, if the tunnelling current drops, this indicates the tunnelling probe is moving farther from the surface of the molecular memory medium. The rate and direction of change of the tunnelling current is processed by the computer 140, which feeds correction signals to the fine height positioning control unit 130, to cause the fine height positioner 55 to raise or lower the tunnelling probe 40 to maintain the tunnelling probe at the height required by the particular memory technique used on the molecular memory disk 30.

The tunnelling probe 40 and its associated read/write electronics write data in domains along the track using an alternating control voltage such that the data pattern written will never match a track number or a sector address. Thus, the tunnelling probe is only in write mode when writing bits in the zero state, and is in read mode at all other times. Consequently, the voltage applied to the tunnelling prove always alternates from sense read mode to write mode in the process of writing a few bits. This can be ensured by encoding incoming data using a non-return to zero (NRZ) algorithm before the data is written on the molecular memory disk. This form of encoding also has the advantage of being self clocking when in read mode. Also, the bit stream fed to the tunnelling probe is guaranteed to return to a read sense mode often enough to continuously measure the height of the tunnelling probe during the write operation.

FIG. 12 shows binary data recorded along the tracks after encoding using the NRZ algorithm. For example, recorded along the first track 2000 are the bits resulting from NRZ-encoding the binary data 1010101. NRZ encoding is applied by duplicating each bit of the incoming data, and exclusive OR-ing (XOR-ing) the result with a double frequency clock. The resulting bit stream is then recorded along the track. In FIG. 12, a bit in the zero state is represented by the absence of a carbon atom, depicted in the drawing by an open circle. A bit in the one state is represented by the existence of a carbon atom, depicted in the drawing by a filled shaded circle. Thus, data is recorded as follows:

| Track 2000: | | |
| --- | --- | --- |
| | clock | 10101010101010 |
| | data | 11001100110011 |
| | XOR | 01100110011001 |
| Track 2010: | | |
| | clock | 10101010101010 |
| | data | 11110000111100 |
| | XOR | 01011010010110 |
| Track 2020: | | |
| | clock | 10101010101010 |
| | data | 11111100000011 |
| | XOR | 01010110101001 |
| Track 2030: | | |
| | dock | 10101010101010 |
| | data | 11111111000000 |
| | XOR | 01010101101010 |

The NRZ-encoded data can be read along each track, reading from bottom to top. However, the fourteenth bit has been omitted from the drawing.

4. Compensation for Surface Defects

One of the most difficult problems with a molecular memory medium is that of obtaining a surface that is flat at atomic dimensions. Another problem is the impractically large amount of time needed to pre-format a disk surface if it is necessary to read and write every track to discern the topography of the surface. The present invention overcomes these obstacles by scanning only a small fraction of the surface of the molecular memory disk, then interpolating the data thus obtained to determine the surface topology in the regions between the tracks whose topology has been measured.

As the surfaces of most molecular memory media are not completely flat, and contain sudden, sharp discontinuities in the surface height, the following mechanism may be used in the disk drives according to the invention to operate with molecular memory media with such uneven surfaces. An example of a surface with sudden, sharp discontinuities is the surface of graphite.

Before the molecular memory disk 30 can be used in the read/write mode, the surface of the molecular memory disk must be formatted. This process first involves reading the surface height contours of the surface of the molecular memory disk by stepping the tunnelling probe 40 radially from the innermost to the outermost positions on the disk, and recording any defects and surface contours in a memory of the computer 140. It is not necessary to scan every track on the surface. As step defects most often follow a linear path over relatively long distances, the position of the step defect in tracks lying between the measured tracks can be interpolated from the position values determined from tracks measured in the initial scan.

The next step in the formatting operation is to write track numbers and optional sector addresses at preselected locations on the surface of the molecular memory disk 30. This defines the positions of the tracks on the molecular memory disk, and is typically done in a sequential track and sector operation. In this, each track number and each optional sector address is written immediately adjoining the preceding track and sector. To save time, only a fraction of the total tracks, spaced at regular intervals, may be written. Finally, the defect and contour information is written at a known location on the disk.

The defect and contour information may be later retrieved from the molecular memory disk 30 when needed to correct the process of reading and writing the molecular memory disk. This information, after being retrieved from the disk, is used by the computer 140 to control the fine height positioner 55, and to disable reading from and writing to defective parts of the molecular memory disk.

When used to control the fine height positioner 55, the information indicating the position of a step on a track requires that a sharp control voltage change be supplied to the fine height positioner. The voltage step-must be of sufficient magnitude to raise or lower the tunnelling probe 40 to match the step in the surface of the molecular memory disk 30. While the tunnelling probe is negotiating the step, it may be desirable to disable reading from or writing to the molecular memory disk.

The topology information may also include information defining the slope of tilted plateaus on the surface of the molecular memory disk. This allows the control voltage from the fine height control unit to change the fine height positioner gradually to maintain the tunnelling probe at the height relative to the surface of the disk that allows the tunnelling probe to operate optimally for reading and writing.

Alternatively, disk drive apparatus 1 may determine surface topology information of the molecular memory disk 30 as it is needed, rather than pre-scanning the disk and storing the results on the disk. When it is desired to write to a certain area of the disk, scans are made of tracks at defined, and preferably equal, intervals in the write area, to derive an approximate surface topology for the write area. This information is then interpolated using a suitable algorithm to derive the surface topology of the tracks situated between the scanned tracks. This information is then stored at a predetermined location on the surface of the molecular memory disk. This information can be later read when the stored information is to be read, and is used as described above to facilitate correct tracking of the tunnelling probe over the surface of the molecular memory disk.

There are two approaches to performing a pre-scan of the surface topology of pan of the molecular memory disk 30. The first requires that the disk rotation speed be reduced to one that is slow enough that moving the tunnelling probe 40 up and down to follow the unknown contours happens sufficiently slowly that there is sufficient time for the height feedback loop to work properly.

The second approach allows the disk to remain spinning at its normal operating speed. The tunnelling probe 40 is gradually lowered towards the disk surface until a tunneling current is detected. The contour of this tunnelling current is then computed, and the result is used to move the tip closer to the surface. The fine height servo (55 and 130) moves the tunnelling probe up over the higher parts of the molecular memory scan that were detected by a higher tunneling current in previous scan, and lowers the tunnelling probe in the remaining area of the disk. This provides a new scan of tunneling current information that includes more information about the surface topology of the disk. The process is repeated until acceptably detailed surface topology information has been obtained for the current track.

In order to minimize the effect of other surface defects, such as contaminant particles or defective write operations such as a head crash, it may be desirable to write copies of each written data item in separate locations on the molecular memory disk 30. These copies may also be made on different tracks, so that the effect of a head crash would be completely recoverable. The computer 140 may also write additional copies of data in new locations on the surface of the molecular memory device if it determines that any one existing copy is defective. The computer performs algorithms for error detection and generating error correction data bits such as CRC and or parity bits.

5. Tunnelling Probe Sharpening

If the read signal from the tunnelling probe 50 loses integrity to the extent that the track number and the optional sector addresses cannot be read, this indicates that the tunnelling probe needs sharpening. To sharpen the tunnelling probe, the tunnelling probe is moved to an area on or off of the surface of the molecular memory disk 30 where there is a very hard surface, such as diamond, in an area which has not been previously used for sharpening. A large voltage pulse is applied between the tunnelling probe and the hard surface. The voltage attracts atoms that are loosely attached to the distal tip of the tunnelling probe, and moves them to the hard surface. The tunnelling probe is then moved to a nearby active portion of the surface of the molecular memory disk 30 to test whether the tunnelling probe can successfully read track numbers. If the track numbers can be: successfully read, the tunnelling probe is returned to normal use. If not, the sharpening procedure is repeated until the tunnelling probe is corrected.

The molecular memory disk drive apparatus may additionally include the particulate filter 35, as shown in FIG. 1. The particulate filter is required when the molecular memory disk 30 includes a recording layer from which atoms or molecules are removed to change the positional state of an atom in the domain in which a bit is stored.

The particulate filter 35 is disposed radially over the surface of the molecular memory disk 30, and may have a bias voltage applied to it of sufficient intensity to provide electrostatic attraction of the loose atoms or molecules removed from the surface of the molecular memory disk. The particulate filter also attracts other dust particles from the surface of the disk or from the environment above the surface. The particulate filter has a large surface area, which allows many particles to be attached directly to the surface of the particulate filter. The particulate filter has a sticky surface to which the particles attracted thereto remain attached, even after the removal of the bias voltage.

D. Molecular Memory Disk Drive Variations

1. Molecular Memory Disk Drive—First Variation

Figure 8:
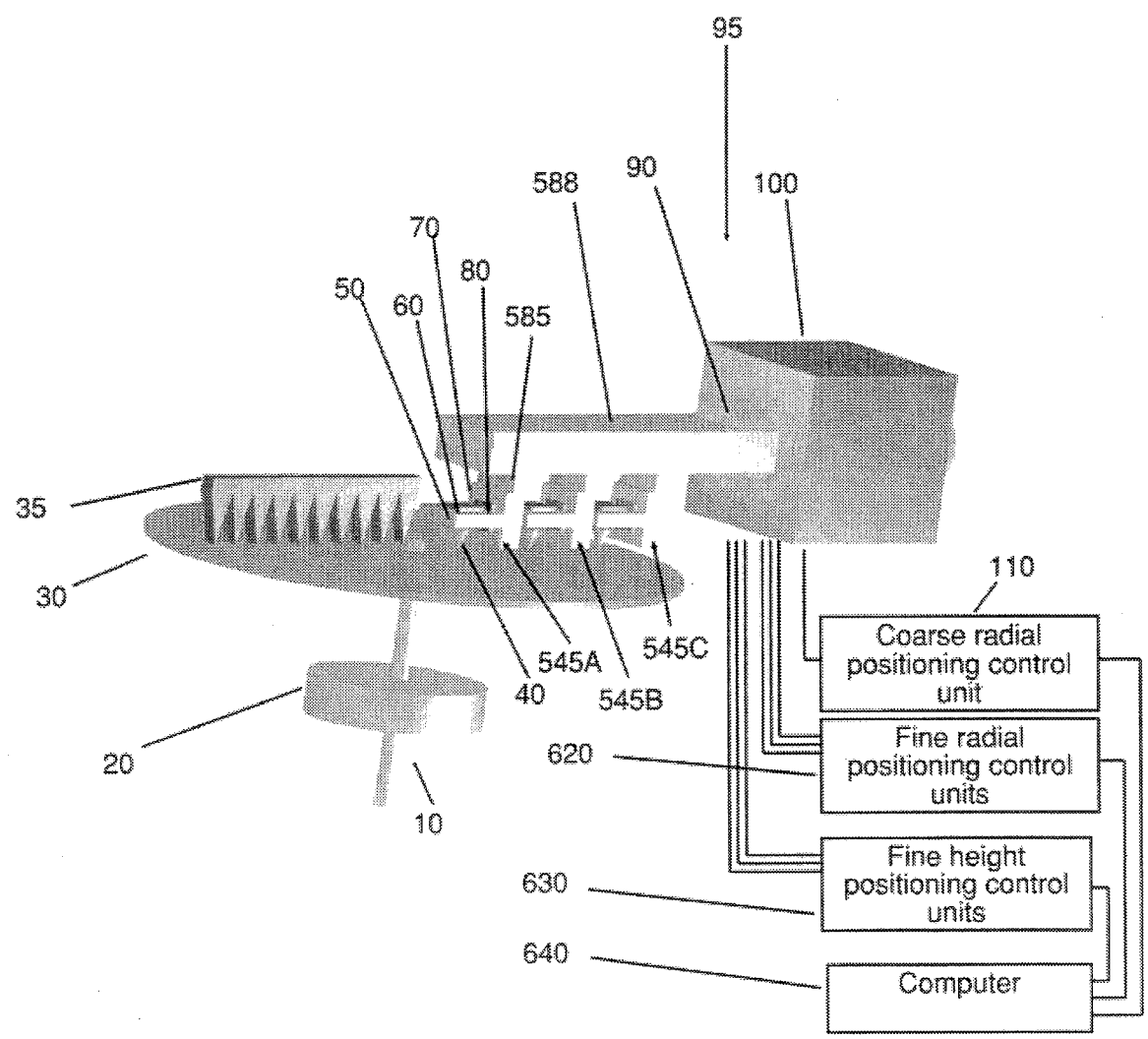
FIG. 8 shows an embodiment of a molecular disk drive apparatus according to the present invention utilizing multiple tunnelling probes and a single disk memory surface.

FIG. 8 shows an embodiment of a molecular memory disk drive apparatus according to the invention in which multiple head assemblies, each including a tunnelling probe, are provided on a single face of a single molecular memory disk. The drive motor 20 rotates the molecular memory medium in the form of a molecular memory disk 30 via the coupling 10.

Attached to the movable arm 90 is the master head mounting bracket 588 on which are mounted multiple head assemblies 545A, 545B, and 545C. Each of the individual head assemblies is similar, so only the head assembly 545A will be described. The head assembly 545A consists of an individual head mounting bracket 585; a fine radial positioner 575, consisting of a piezoelectric transducer 70 with electrodes 80; a fine height positioner 555, consisting of a piezoelectric transducer 50 with electrodes 60; and a tunnelling probe 40. The construction and operation of each of the head assemblies 545A, 545B, and 545C are the same as those of the head assembly 45 described above with respect to FIG. 1, and will therefore not be described further.

The individual head assemblies 545A, 545B, and 545C are radially positioned by the coarse positioner 95, consisting of the electromagnetic drive coil 100 positioning the magnetically-movable arm 90, on which the multiple head assemblies 545A, 545B, and 545C are mounted by the master head mounting bracket 588. The coarse positioner 95 moves the tunnelling probes radially, parallel to the surface of the molecular memory disk 30.

The coarse radial control unit 110, the fine radial control units 620, and the fine height control units 630 are controlled by the computer 640.

The motor 10 and coarse radial positioner 95 are attached to an antivibration mount (not shown). Attaching the spindle 20 and the molecular memory disk 30 to the antivibration mount reduces undesired movement of the disk. Attaching the coarse radial positioner 95 to the antivibration mount reduces undesired movement in the arm and head assembly.

The construction just described provides each individual head assembly 545A, 545B, and 545C with separate movement both radially and in height relative to the surface of the molecular memory disk. Individually controlling each tunnelling probe allows individual compensation for surface defects and contours, thermal expansion and contraction of the disk mechanism, unevenness of the disk surface, and vibration.

The head assemblies are aligned, write operations are performed, surface defects are compensated, and the tunnelling probes are sharpened as described above with respect to the first embodiment of the molecular memory disk drive apparatus.

This embodiment of the molecular memory disk drive apparatus may additionally include the particulate filter 35, as shown in FIG. 8. The particulate filter is required when the molecular memory disk 30 includes a recording layer from which atoms or molecules are removed to change the positional state of an atom in the domain in which a bit is stored.

2. Molecular Memory Disk Drive—Second Variation

Figure 9:
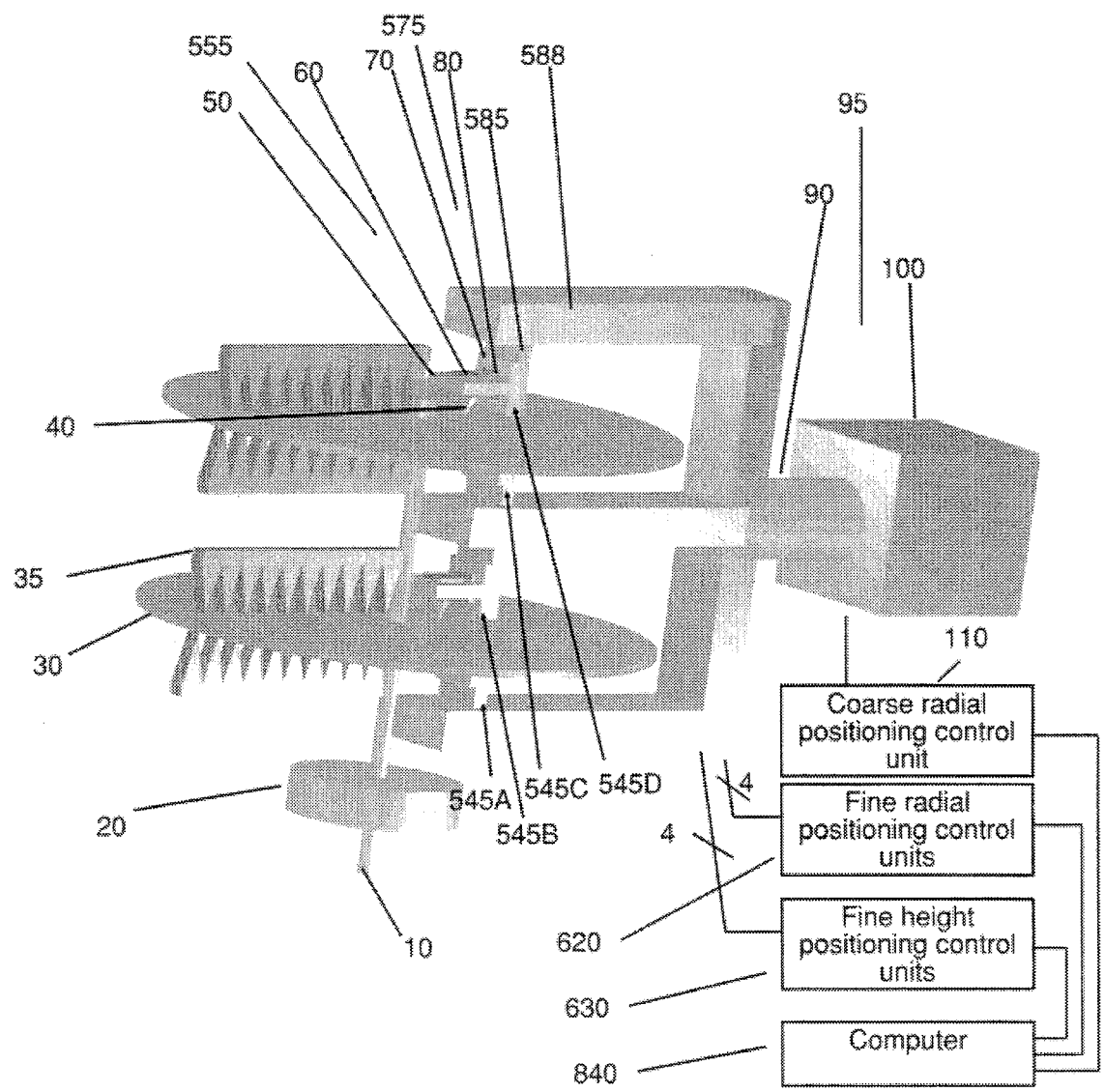
FIG. 9 shows an embodiment of a molecular disk drive apparatus according to the present invention utilizing one tunnelling probe for each memory surface and multiple disk memory surfaces.

FIG. 9 shows an embodiment of a molecular memory disk drive apparatus according to the invention in which one head assembly, including a tunnelling probe, is provided for each of multiple surfaces on each of multiple molecular memory disks. The drive motor 20 rotates the molecular memory medium in the form of a first molecular memory disk 30 and a second molecular memory disk 39 via the coupling 10. Each of the molecular memory disks has two faces, for example, the molecular memory disk 30 has an upper face and a lower face.

Attached to the movable arm 90 is the master head mounting bracket 588, on which are mounted four individual head assemblies 545A through 545D, one for each face of each of the molecular memory disks 30 and 39. Each of the individual head assemblies is similar, so only the head assembly 545A will be described. The head assembly 545A includes the head mounting bracket 585; the fine radial positioner 575 consisting of the piezoelectric transducer 70 with the electrodes 80; a fine height positioner 555, consisting of the piezoelectric transducer 50 with the electrodes 60; and the tunnelling probe 40. The construction and operation of each of the head assemblies 545A through 545D is the same as those of the head assembly 45 described above with respect to FIG. 1, and will therefore not be described further.

The individual head assemblies 545A through 545D are positioned radially by the coarse radial positioner 95, consisting of the electromagnetic drive coil 100 positioning the magnetically movable arm 90, on which the individual head assemblies 545A through 545D are mounted by the master head mounting bracket 588. The coarse radial positioner moves the tunnelling probes, such as the tunnelling probe 40, radially, parallel to the surface of the respective molecular memory disk.

The coarse radial control unit 110, the fine radial control units 620, and the fine height control units 630 are controlled by a computer 840.

The motor 10 and the coarse radial positioner 95 are attached to an antivibration mounting. Attaching the spindle 20 and disks 30 and 39 to the antivibration mounting reduces undesired movement of the disks. Attaching the coarse radial positioner to antivibration mounting reduces undesired movement in the arm and head assembly.

The construction just described provides each individual head assembly 545A through 545D with separate movement both radially and in height relative to the respective surface of the molecular memory disk. Individually controlling the tunnelling probe operating on each face of the disks 30 and 39 allows individual compensation for surface defects and contours, thermal expansion and contraction of the disk mechanism, unevenness of the disk surface, and vibration.

The head assemblies are aligned, write operations are performed, surface defects are compensated, and the tunnelling probes are sharpened as described above with respect to the first embodiment of the molecular memory disk drive apparatus.

This embodiment of the molecular memory disk drive apparatus may additionally include a particulate filter, such as the particulate filter 35, for each surface of each molecular memory disk, as shown in FIG. 9. The particulate filter is required when the molecular memory disks 30 and 39 include a recording layer from which atoms or molecules are removed to change the positional state of an atom in the domain in which a bit is stored.

3. Molecular Memory Disk Drive—Third Variation

Figure 10:
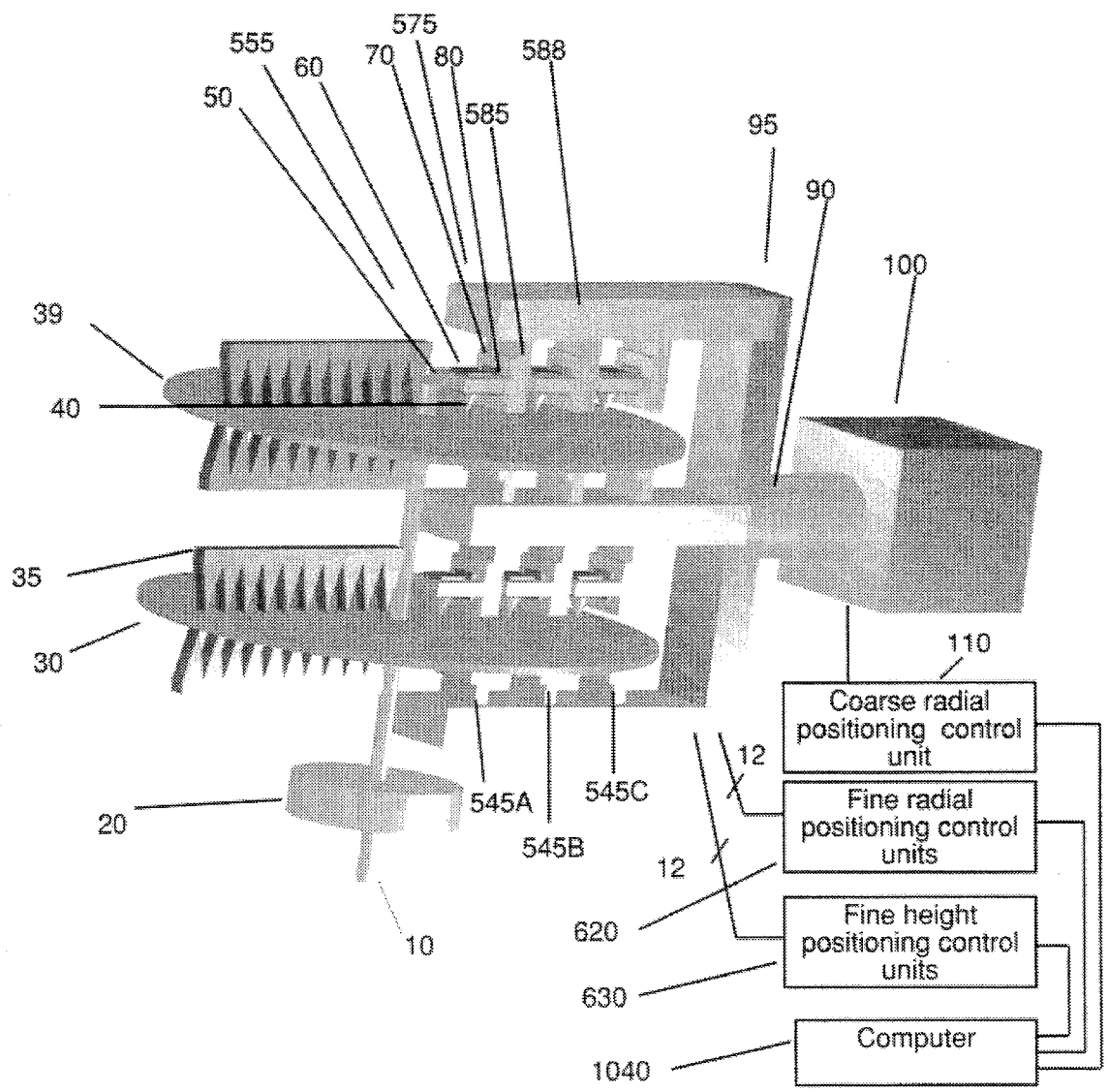
FIG. 10 shows an embodiment of a molecular disk drive apparatus according to the present invention utilizing multiple tunnelling probes for each memory surface and multiple disk memory surfaces.

FIG. 10 shows an embodiment of a molecular memory disk drive apparatus according to the invention in which multiple head assemblies, each including a tunnelling probe, are provided on each of multiple surfaces of each of multiple molecular memory disks. The drive motor 20 rotates the molecular memory medium in the form of a first molecular memory disk 30 and a second molecular memory disk 39 via the coupling 10. Each of the molecular memory disks has two faces, for example, the molecular memory disk 30 has an upper face and a lower face.

Attached to the movable arm 90 is the master head mounting bracket 585, on which are mounted individual the twelve head assemblies 545A through 545L, three: for each face of each of the molecular memory disks 30 and 39. Each of the multiple head assemblies is similar, so only the head assembly 545A will be described. The head assembly 545A consists of an individual head mounting bracket 585; a fine radial positioner 575, consisting of a piezoelectric transducer 70 with electrodes 80; a fine height positioner 555, consisting of a piezoelectric transducer 50 with electrodes 60; and a tunnelling probe 40. The construction and operation of each of the head assemblies 545A through 545L are the same as those of the head assembly 45 described above with respect to FIG. 1, and will therefore not be described further.

The multiple head assemblies 545A through 545L are radially positioned by the coarse radial positioner 95, consisting of the electromagnetic drive coil 100 positioning the magnetically movable arm 90, on which the multiple head assemblies 545A through 545L are mounted by the master head bracket 588. The coarse positioner 95 moves the tunnelling probes radially, parallel to the surface of the molecular memory disk 30.

The coarse radial control unit 110, the fine radial control units 620, and the fine height control units 630 are controlled by the computer 1040.

The motor 10 and the coarse radial positioner 95 are attached to an antivibration mounting (not shown). Attaching the spindle 20 and disks 30 and 39 to the antivibration mounting reduces undesired movement of the disks. Attaching the coarse radial positioner to antivibration mounting reduces undesired movement in the arm and head assembly.

The construction just described provides each individual head assembly 545A through 545L with separate movement both radially and in height relative the surface of the respective molecular memory disk. Individually controlling each of the tunnelling probes operating on each face of the molecular memory disks 30 and 39 allows individual compensation for surface defects and contours, thermal expansion and contraction of the disk mechanism, unevenness of the disk surface, and vibration.

The head assemblies are aligned, write operations are performed, surface defects are compensated, and the tunnelling probes are sharpened as described above with respect to the first embodiment of the molecular memory disk drive apparatus.

This embodiment of the molecular memory disk drive apparatus may additionally include a particulate filter, such as the particulate filter 35, for each surface of each molecular memory disk, as shown in FIG. 10. The particulate filter is required with the molecular memory disks 30 and 39 that include a recording layer from which atoms or molecules are removed to change the positional state of an atom in the domain in which a bit is stored.

4. Molecular Memory Disk Drive—Fourth Variation

Figure 11:
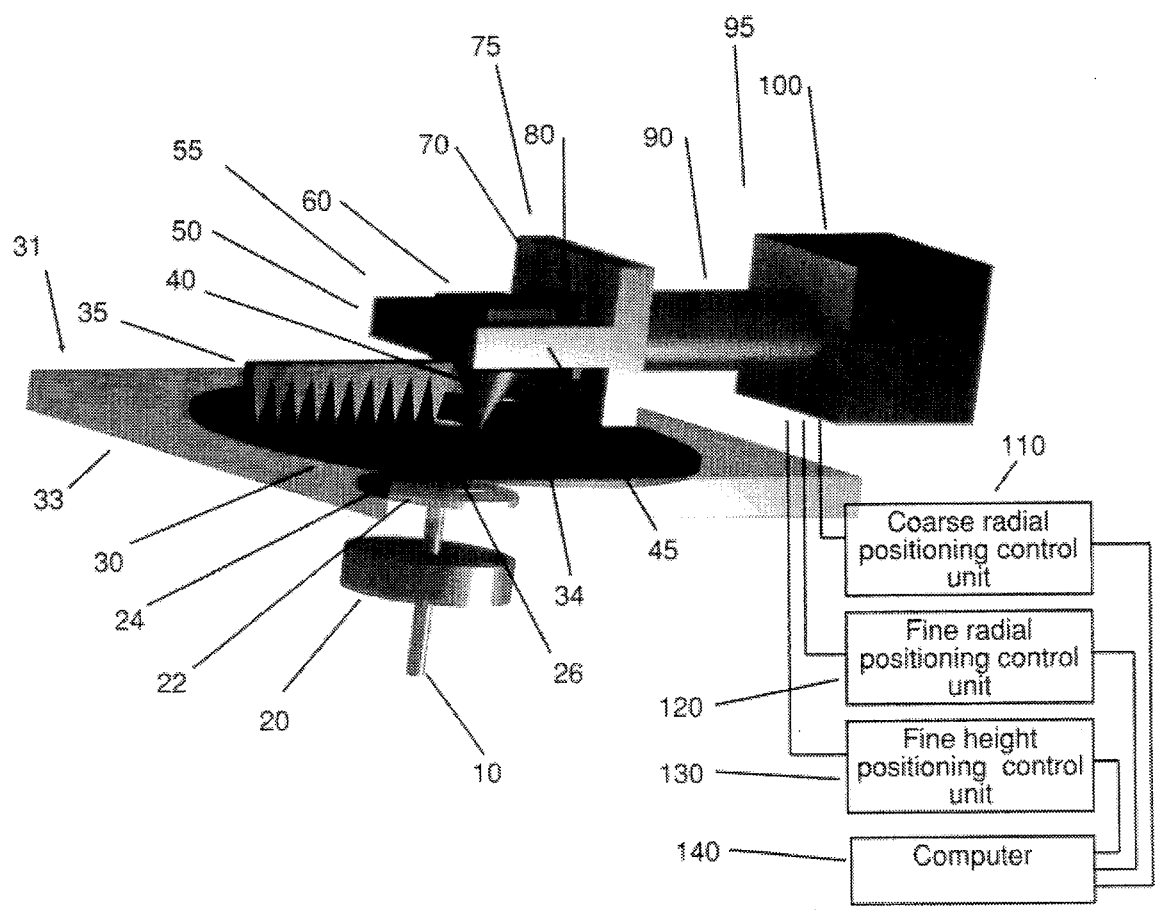
FIG. 11 shows an embodiment of a molecular disk drive apparatus according to the present invention utilizing a removable molecular memory disk cartridge.

FIG. 11 shows an embodiment of a molecular memory disk drive apparatus according to the invention in which the molecular memory medium, in the form of a molecular memory disk, is enclosed in a removable cartridge. The removable cartridge 31 comprises the housing 33 with the head window 34 and a sliding shutter (not shown). The drive engaging plate 24 is connected to the cartridge spindle 26, which, in turn, is connected to molecular memory disk 30. The drive motor 20 rotates the molecular memory disk 30 via the spindle 10 connected to the drive plate 22. The drive plate 22 engages with the drive engaging plate 24 to rotate the molecular memory disk 30.

A conductive path must be provided between the molecular memory disk 30 and the tunnelling probe 40. The tunnelling probe 40 is positioned by the coarse positioner 95 consisting of the electromagnetic drive coil 100 positioning the magnetically movable arm 90, on which the head assembly 45 is mounted.

The head assembly 45 consists of the fine radial positioner 75, consisting of the piezoelectric transducer 70 with the electrodes 80; the fine height positioner 55 consisting of the piezoelectric transducer 50 with the electrodes 60; and the tunnelling probe 40.

The coarse radial positioner 95 moves the tunnelling probe 40 parallel to the surface of the molecular memory disk 30. The fine radial positioner 75 and the fine height positioner 55 are constructed and operate the same as the corresponding components described above with respect to the first embodiment, and so will not be described further here.

The coarse radial control unit 110, the fine radial control unit 120, fine height control unit 130 are controlled by the computer 140.

The motor 10 and the coarse radial positioner 95 are attached to an antivibration mounting. Attaching the spindle 20 and disk 30 to the antivibration mounting reduces undesired movement of the disks. Attaching the coarse radial positioner to antivibration mounting reduces undesired movement in the arm and head assembly.

The head assembly is aligned, write operations are performed, surface defects are compensated, and the tunnelling probe is sharpened as described above with respect to first embodiment of the molecular memory disk drive apparatus.

This embodiment of the molecular memory disk drive apparatus may additionally include a particulate filter, such as the particulate filter 35, for each surface of each molecular memory disk, as shown in FIG. 11. The particulate filter is required when the molecular memory disk 30 includes a recording layer from which atoms or molecules are removed to change the positional state of an atom in the domain in which a bit is stored.

Although illustrative embodiments of the invention have been described herein in detail, it is to be understood that the invention is not limited to the precise embodiments described, and that various modifications may be practiced within the scope of the invention defined by the appended claims.

I claim:

1. A medium for storing digital bits continuously written by a tunnelling probe, the stored digital bits being readable from the medium by the tunnelling probe, each of the digital bits having plural logical states, the medium comprising:

a plane recording layer including plural first atoms arranged in a lattice structure including a surface plane, the recording layer having arrayed therein plural memory elements, each storing one of the digital bits and including at least one second atom coupled to plural ones of the first atoms in a positionally-variable arrangement having plural stable positional states, each one of the positional states being distinguishable from the others of the positional states by a difference in a tunnelling current in the tunnelling probe, the at least one second atom in each of the memory elements being switchable from any one of the positional states to a selected other of the positional states by an electrostatic force applied by the tunnelling probe without lateral movement of the tunnelling probe, each of the positional states of the at least one second atom in each of the memory elements representing a respective one of the logical states of the one of the digital bits stored therein, the at least one second atom and the positionally-variable arrangement being selected from a group consisting of:

(a) the at least one second atom is a second atom covalently bonded to the plural ones of the first atoms forming the surface plane, the second atom being recessed below the surface plane in a first one of the positional states, and, in response to the electrostatic force applied by the tunnelling probe, moves while remaining bonded to the plural ones of the first atoms to a second one of the positional states wherein the second atom projects above the surface plane, the second atom moving in a direction substantially perpendicular to the surface plane, (b) the at least one second atom is plural second atoms arranged in an asymmetrical molecule, the asymmetrical molecule being bonded to the plural ones of the first atoms forming the surface plane, the asymmetrical molecule having plural stable rotational orientations relative to the surface plane, each of the stable rotational orientations providing one of the positional states, the asymmetrical molecule moving rotationally relative to the surface plane in response to the electrostatic force applied by the tunnelling probe while remaining bonded to the plural ones of the first atoms, the asymmetrical molecule moving rotationally from one of the stable rotational orientations to another of the stable rotational orientations to provide the plural positional states, and (c) the at least one second atom consists of a second atom forming a plane matrix with other atoms of the same element as the second atom, the plane matrix being deposited on the surface plane and having a different structure from the lattice structure of the Surface plane, the second atom being in a first position relative to the other atoms forming the plane matrix in a first one of the positional states, and, in response to the electrostatic force applied by the tunnelling probe, changes position relative to the other atoms forming the plane matrix while remaining bonded to adjacent ones of the other atoms forming the plane matrix, the second atom moving to a second one of the positional states wherein the second atom is a second position relative to the other atoms forming the plane-matrix; land means for moving the recording layer relative to the tunnelling probe.

2. The medium of claim 1, wherein the second atom and the other atoms of the same type as the second atom forming the plane matrix are deposited on the plane surface in a layer about one atom thick.

3. The medium of claim 1, wherein:

the second atom covalently bonded to the first atoms are hydrogen atoms; and, the first atoms are carbon atoms, arranged in a graphite structure.

4. The medium of claim 1, additionally comprising cartridge means for enclosing and protecting the recording layer, the cartridge means including a closable window means for providing access to the recording layer.

5. The medium of claim 1, wherein:

the second atom forming the plane matrix is an atom of a Group IV element; and the first atoms are atoms of a Group IV element.

6. The medium of claim 1 wherein:

the second atom forming the plane matrix is a carbon atom; and the first atoms are silicon atoms.

7. The medium of claim 1, wherein the second atoms forming the rotationally asymmetrical molecule move rotationally relative to the surface plane about an axis parallel to the surface plane.

8. The medium of claim 1, wherein the second atoms forming the rotationally asymmetrical molecule move rotationally relative to the surface plane about an axis perpendicular to the surface plane.

9. The medium of claim 1, wherein the second atoms forming the rotationally asymmetrical molecule move rotationally relative to the surface plane about an axis oblique to the surface plane.

10. The medium of claim 1, wherein:

the first atoms are carbon atoms; and the second atoms forming the rotationally asymmetrical molecule form a rotationally asymmetrical molecule chosen from a group consisting of cyclohexene and cytosine.

11. Apparatus for storing and reading digital bits, each of the stored digital bits being in one of a first logical state and a second logical state, the apparatus comprising:

a tunnelling probe, a storage medium, mounted in relation to the tunnelling probe and separated therefrom by a distance, the storage medium including:

a recording layer including plural first atoms arranged in a lattice structure including a surface plane, the recording layer having a topology and including a track having arrayed therealong plural memory elements, each storing one of the digital bits and including at least one second atom coupled to plural ones of the first atoms in an arrangement permitting the at least one second atom to be removed from the respective one of the memory elements, ones of the memory elements in which the at least one second atom is present being distinguishable by a difference in a tunnelling current in the tunnelling probe from ones of the memory elements in which the at least one second atom is absent following removal, each of the memory elements in which the at least one second atom is present being one of the memory elements wherein one of the digital bits in the first logical state is stored, and each of the memory elements in which the at least one second atom is absent following removal being one of the memory elements wherein one of the digital bits in the second logical state is stored;

driving means for continuously moving the storage medium relative to the tunnelling probe;

means for supplying topology information representing the topology of the recording layer;

control means for positioning the tunnelling probe relative to the track and for setting the distance of the tunnelling probe from the recording layer of the storage medium in response to the topology information supplied by the means for supplying topology information;

voltage applying means for applying a voltage to the tunnelling probe;

reading means for causing the voltage applying means to selectively apply a first voltage to the tunnelling probe, for measuring a resulting tunnelling current that depends on the positional state of the at least one second atom in the one of the memory elements adjacent the tunnelling probe, for determining from the tunnelling current the logical state of the one of the digital bits stored in the one of the memory elements adjacent the tunnelling probe, and for providing a signal representing the logical state of the one of the digital bits as a reproduced output bit; and writing means for causing the voltage applying means to selectively apply a second voltage, greater than the first voltage, to the tunnelling probe to cause the tunnelling probe to apply an electrostatic field to remove the at least one second atom from the one of the memory elements adjacent the tunnelling probe, the tunnelling probe applying the electrostatic field without lateral movement relative to the at least one second atom.

12. The apparatus of claim 11, wherein the at least one second atom is embedded in the lattice structure of the first atoms positioned below the surface plane.

13. The apparatus of claim 11, wherein the at least one second atom is at least one Group III or Group V impurity atom, and the first atoms are Group IV atoms, the at least one second atom and the plural ones of the first atoms together forming a plane matrix providing the surface plane.

14. The apparatus of claim 11, wherein the control means includes means for measuring the distance of the tunnelling probe from the recording layer by measuring the tunnelling current.

15. The apparatus of claim 11, wherein:

the writing means includes means for receiving each of the digital bits to be stored on the storage medium; and the writing means causes the voltage applying means to apply the second voltage to the tunnelling probe for each of the digital bits in the first logical state to remove the at least one second atom from the one of the memory elements adjacent the tunnelling probe.

16. The apparatus of claim 15, wherein, for each of the digital bits in the second logical state:

the writing means causes the voltage applying means to apply the first voltage to the tunnelling probe to establish a tunnelling current; and the control means sets the distance between the tunnelling probe and the recording layer of the storage medium by measuring the tunnelling current.

17. A medium for storing digital bits continuously written by a tunnelling probe, the stored digital bits being-readable from the medium by the tunnelling probe, each of the digital bits being in one of a first logical state and a second logical state, the medium comprising:

a plane recording layer including plural first atoms arranged in a lattice structure including a surface plane, the recording layer having arrayed therein plural memory elements, each storing one of the digital bits and including at least one second atom coupled to plural ones of the first atoms in an arrangement permitting the at least one second atom to be removed from the respective one of the memory elements by an electrostatic force applied by the tunnelling probe without lateral movement of the tunnelling probe, ones of the memory elements in which the at least one second atom is present being distinguishable by a difference in a tunnelling current in the tunnelling probe from ones of the memory elements in which the at least one second atom is absent following removal, each of the memory elements in which the at least one second atom is present being one of the memory elements wherein one of the digital bits in the first logical state is stored, and each of the memory elements in which the at least one second atom is absent following removal being one of the memory elements wherein one of the digital bits in the second logical state is stored, the arrangement of the first atoms and the least one second atom being selected from a group consisting of:

(a) the at least one second atom is embedded in the lattice structure of the first atoms positioned below the surface plane; and (b) the at least one second atom is at least one Group III or Group V impurity atom, and the first atoms are Group IV atoms, the at least one second atom and the plural ones of the first atoms together forming a plane matrix providing the surface plane; and means for moving the recording layer relative to the tunnelling probe.

18. The medium of claim 17, wherein:

the at least one second atom embedded in the lattice structure comprises at least one helium atom; and the first atoms are carbon atoms arranged in a graphite structure.

19. The medium of claim 17, wherein:

the at least one second element forming a plane matrix is at least one atom of an element selected from a group consisting of boron, arsenic, and phosphorus; and the first atoms are silicon atoms.

20. The medium of claim 17, additionally comprising cartridge means for enclosing and protecting the recording layer, the cartridge means including a closable window means for providing access to the recording layer.

21. Apparatus for reading stored digital bits, each of the stored digital bits being in one of plural logical states, the apparatus comprising:

a tunnelling probe, a storage medium, mounted in relation to the tunnelling probe and separated therefrom by a distance, the storage medium including:

a recording layer including plural first atoms arranged in a lattice structure including a surface plane, the recording layer having a topology and including a track having arrayed therealong plural memory elements, each storing one of the digital bits and including at, least one second atom coupled to plural ones of the first atoms in a positionally-variable arrangement having plural stable positional states, each one of the positional states being distinguishable from the others of the positional states by a difference in a tunnelling current in the tunnelling probe, the at least one second atom being capable of being switched from any one of the positional states to a selected other of the positional states by an electrostatic force applied without lateral movement relative to the at least one second atom, each of the positional states of the at least one second atom in each of the memory elements representing a respective one of the logical states of the one of the digital bits stored therein;

driving means for continuously moving the storage medium relative to the tunnelling probe;

means for supplying topology information representing the topology of the recording layer;

control means for positioning the tunnelling probe relative to the track and for setting the distance of the tunnelling probe from the recording layer of the storage medium in response to the topology information supplied by the means for supplying topology information;

voltage applying means for applying a voltage to the tunnelling probe;

means for causing the voltage applying means to apply a first voltage to the tunnelling probe and for measuring a resulting tunnelling current that depends on the positional state of the at least one second atom in the one of the memory elements adjacent the tunnelling probe; and means for determining from the tunnelling current the logical state of the one of the digital bits stored in the one of the memory elements adjacent the tunnelling probe and for providing a signal representing the logical state of the one of the digital bits as a reproduced output bit.

22. The apparatus of claim 21, additionally for continuously writing digital bits on the storage medium, and additionally comprising:

means for receiving the digital bits to be stored on the storage medium;

means for causing the voltage applying means to apply a second voltage, greater than the first voltage, to the tunnelling probe for each of the digital bits in a first one of the logical states, the second voltage generating the electrostatic field to change the at least one second atom in the one of the memory elements adjacent to the tunnelling probe to a second one of the positional states, and for causing the voltage applying means to apply the first voltage to the tunnelling probe for each of the digital bits in a second one of the logical states, to write the each of the digital bits on the storage medium.

23. The apparatus of claim 22, wherein, for each of the digital bits in a second one of the logical states:

the means for causing causes the voltage applying means to apply the first voltage to the tunnelling probe to establish a tunnelling current; and the control means sets the distance between the tunnelling probe and the recording layer of the storage medium by measuring the tunnelling current.

24. The apparatus of claim 21, wherein the control means includes positioning means for positioning the tunnelling probe relative to the track and for setting the distance between the tunnelling probe and the recording layer of the storage medium.

25. The apparatus of claim 21, wherein: the tunnelling probe includes a fine tip; and the apparatus additionally comprises:

means for determining when the fine tip requires sharpening; and means for sharpening the fine tip in response to a determination that the fine tip requires sharpening.

26. The apparatus of claim 21, additionally comprising:

a chamber wherein the medium and the tunnelling probe are sealed; and cleaning means, mounted adjacent to the storage medium, for removing contaminants from the vicinity of the storage medium.

27. The apparatus of claim 21, wherein: the apparatus additionally comprises:

means for measuring the topology of a small part of the recording layer to provide a topology sample, and means for extrapolating the topology information from the topology sample obtained by measuring the small part of the recording layer; and the means for supplying topology information includes means for storing the topology information generated by the means for extrapolating.

28. The apparatus of claim 21, wherein the storage medium is circular, and the means for moving the storage medium relative to the tunnelling probe rotates the storage medium.

29. The apparatus of claim 21, for reading digital bits off a detachable storage medium housed in a cartridge, the apparatus additionally comprising:

means for receiving the cartridge;

means for engaging the driving means with the storage medium; and means for moving the tunnelling probe into proximity of the recording layer of the storage medium.

30. The apparatus of claim 21, wherein the control means includes means for measuring the distance of the tunnelling probe from the recording layer by measuring the tunnelling current.

31. Apparatus for storing and reading digital bits, each of the stored digital bits being in one of plural logical states, the apparatus comprising:

a tunnelling probe, a storage medium, mounted in relation to the tunnelling probe and separated therefrom by a distance, the storage medium including:

a recording layer including plural first atoms arranged in a lattice structure including a surface plane, the recording layer having a topology and including a track having arrayed therealong plural memory elements, each storing one of the digital bits, each of the memory elements including at least one second atom coupled to plural ones of the first atoms in a positionally-variable arrangement having plural stable positional states, each one of the positional states being distinguishable from the others of the positional states by a difference in a tunnelling current in the tunnelling probe, each of the positional states of the at least one second atom in each of the memory elements representing a respective one of the logical states of the one of the digital bits stored therein;

driving means for continuously moving the storage medium relative to the tunnelling probe;

means for supplying topology information representing the topology of the recording layer;

control means for positioning the tunnelling probe relative to the track and for setting the distance of the tunnelling probe from the recording layer of the storage medium in response to the topology information supplied by the means for supplying topology information;

voltage applying means for applying a voltage to the tunnelling probe;

reading means for causing the voltage applying means to selectively apply a first voltage to the tunnelling probe, for measuring a resulting tunnelling current that depends on the positional state of the at least one second atom in the one of the memory elements adjacent the tunnelling probe, for determining from the tunnelling current the logical state of the one of the digital bits stored in the one of the memory elements adjacent the tunnelling probe, and for providing a signal representing the logical state of the one of the digital bits as a reproduced output bit; and writing means for causing the voltage applying means to selectively apply a second voltage, greater than the first voltage, to the tunnelling probe to cause the tunnelling probe to apply an electrostatic field to the at least one second atom in one of the positional states in one of the memory elements adjacent the tunnelling probe, the tunnelling probe applying the electrostatic field without lateral movement relative to the at least one second atom to switch the at least one second atom to a selected other one of the positional states.

32. The apparatus of claim 31, wherein the at least one second atom is covalently bonded to the ones of the first atoms forming the surface plane, the at least one second atom being positioned below the surface plane in a first one of the positional states, and projecting from the surface plane in a second one of the positional states.

33. The apparatus of claim 31, wherein the at least one second atom consists of plural second atoms arranged in a rotationally asymmetrical molecule loosely bonded to plural ones of the first atoms forming the surface plane, the rotationally asymmetrical molecule having plural stable rotational orientations relative to the surface plane, each of the stable rotational orientations being one of the positional states.

34. The apparatus of claim 31, wherein:

the writing means includes means for receiving each of the digital bits to be stored on the storage medium; and the writing means causes the voltage applying means to apply the second voltage to the tunnelling probe for each of the digital bits in a first one of the logical states to change the at least one second atom of the one of the memory elements adjacent the tunnelling probe to the one of the positional states representing the first one of the logical states.

35. The apparatus of claim 34, wherein, for each of the digital bits in a second one of the logical states:

the writing means causes the voltage applying means to apply the first voltage to the tunnelling probe to establish a tunnelling current; and the control means sets the distance between the tunnelling probe and the recording layer of the storage medium by measuring the tunnelling current.

36. The apparatus of claim 31, wherein the control means includes means for measuring the distance of the tunnelling probe from the recording layer by measuring the tunnelling current.

37. The apparatus of claim 31, wherein the at least one second atom consists of a second atom forming a plane matrix with plural atoms of the same element as the at least one second atom, the plane matrix being deposited on the surface plane and having a different structure from the lattice structure of the surface plane, the second atom being in a first position relative to the other atoms forming the plane matrix in a first one of the positional states, and being in a second position relative to the other atoms forming the plane matrix in a second one of the positional states.

38. Apparatus for reading stored digital bits, each of the stored digital bits being in one of a first logical state and a second logical state, the apparatus comprising:

a tunnelling probe, a storage medium, mounted in relation to the tunnelling probe and separated therefrom by a distance, the storage medium including:

a recording layer including plural first atoms arranged in a lattice structure including a surface plane, the recording layer having a topology and including a track having arrayed therealong plural memory elements, each storing one of the digital bits and including at least one second atom coupled to plural ones of the first atoms in an arrangement permitting the at least one second atom to be removed from the respective one of the memory elements by an electrostatic force applied without lateral movement relative to the at least one second atom, ones of the memory elements in which the at least one second atom is present being distinguishable by a difference in a tunnelling current in the tunnelling probe from ones of the memory elements in which the at least one second atom is absent following removal, each of the memory elements in which the at least one second atom is present being one of the memory elements wherein one of the digital bits in the first logical state is stored, and each of the memory elements in which the at least one second atom is absent following removal being one of the memory elements wherein one of the digital bits in the second logical state is stored;

driving means for continuously moving the storage medium relative to the tunnelling probe;

means for supplying topology information representing the topology of the recording layer;

control means for positioning the tunnelling probe relative to the track and for setting the distance of the tunnelling probe from the recording layer of the storage medium in response to the topology information supplied by the means for supplying topology information;

voltage applying means for applying a voltage to the tunnelling probe;

means for causing the voltage applying means to apply a first voltage to the tunnelling probe and for measuring a resulting tunnelling current that depends on whether the at least one second atom is present in the one of the memory elements adjacent the tunnelling probe; and means for determining from the tunnelling current the logical state of the one of the digital bits stored in the one of the memory elements adjacent the tunnelling probe and for providing a signal representing the logical state of the one of the digital bits as a reproduced output bit.

39. The apparatus of claim 38, wherein the control means includes means for measuring the distance of the tunnelling probe from the recording layer by measuring the tunnelling current.

40. The apparatus of claim 38, additionally for continuously writing digital bits one the storage medium, and additionally comprising:

means for receiving .the digital bits to be stored on the storage medium;

means for causing the voltage applying means to apply a second voltage, greater than the first voltage, to the tunnelling probe for each of the digital bits in a first logical state, the second voltage generating the electrostatic field to remove the at least one second atom from the one of the memory elements adjacent to the tunnelling probe, and for causing the voltage applying means to apply the first voltage to the tunnelling probe for each of the digital bits in a second logical state, to write the each of the digital bits on the storage medium.

41. The apparatus of claim 40, wherein, for each of the digital bits in a second logical state:

the means for causing causes the voltage applying means to apply the first voltage 16 the tunnelling probe to establish a tunnelling current; and the control means sets the distance between the tunnelling probe and the recording layer of the storage medium by measuring the tunnelling current.

42. The apparatus of claim 38, wherein the control means includes positioning means for positioning the tunnelling probe relative to the track and for setting the distance between the tunnelling probe and the recording layer of the storage medium.

43. The apparatus of claim 38, wherein:

the tunnelling probe includes a fine tip; and the apparatus additionally comprises:

means for determining when the fine tip requires sharpening; and means for sharpening the fine tip in response to a determination that the fine tip requires sharpening.

44. The apparatus of claim 38, additionally comprising:

a chamber wherein the medium and the tunnelling probe are sealed; and cleaning means, mounted adjacent to the storage medium, for removing contaminants from the vicinity of the storage medium.

45. The apparatus of claim 38, wherein: the apparatus additionally comprises:
   means for measuring the topology of a small part of the recording layer to provide a topology sample, and
   means for extrapolating the topology information from the topology sample obtained by measuring the small part of the recording layer; and
   the means for supplying topology information includes means for storing the topology information generated by the means for extrapolating.

46. The apparatus of claim 38, wherein the storage medium is circular, and the means for moving the storage medium relative to the tunnelling probe rotates the storage medium.

47. The apparatus of claim 38, for reading digital bits off a detachable storage medium housed in a cartridge, the apparatus additionally comprising:
   means for receiving the cartridge;
   means for engaging the driving means with the storage medium; and
   means for moving the tunnelling probe into proximity of the recording layer of the storage medium.

* * * * *